United States Patent [19]
Mizutani

[11] Patent Number: 5,204,535
[45] Date of Patent: Apr. 20, 1993

[54] ALIGNMENT DEVICE HAVING IRRADIATION AND DETECTION LIGHT CORRECTING OPTICAL ELEMENTS

[75] Inventor: Hideo Mizutani, Yokohama, Japan
[73] Assignee: Nikon Corporation, Tokyo, Japan
[21] Appl. No.: 888,828
[22] Filed: May 27, 1992
[30] Foreign Application Priority Data

May 31, 1991 [JP] Japan .................. 3-129563

[51] Int. Cl.$^5$ ............................................ G01N 21/86
[52] U.S. Cl. ........................................ 250/548; 356/401
[58] Field of Search ..................... 250/548, 561, 557; 356/400, 401, 356, 363

[56] References Cited

U.S. PATENT DOCUMENTS

| | | | |
|---|---|---|---|
| 3,865,483 | 2/1975 | Wojcik | 250/548 |
| 4,492,459 | 1/1985 | Omata | 355/43 |
| 4,779,001 | 10/1988 | Makosch | 250/548 |
| 5,004,348 | 4/1991 | Magome | 250/548 |

FOREIGN PATENT DOCUMENTS

0393775 10/1990 European Pat. Off. .

*Primary Examiner*—David C. Nelms
*Assistant Examiner*—Que T. Le
*Attorney, Agent, or Firm*—Shapiro and Shapiro

[57] ABSTRACT

The device is of the type used for semiconductor exposure apparatus equipped with a projection lens for transferring a pattern, formed on a reticle, onto a substrate with an exposure light. The device is adapted for detecting the position of an alignment mark formed on the substrate. The device includes light irradiation means, detector, an irradiation light correcting optical element and a detection light correcting optical element. The light irradiation means irradiates the alignment mark, through the projection lens, with alignment light having a wavelength different from that of the exposure light. The detector detects, through the projection optical system, light from the alignment mark. The irradiation light correcting optical element is provided between the reticle and the substrate and adapted for deflecting the irradiation optical path so as to correct, by predetermined amount, the longitudinal chromatic aberration and the chromatic aberration of magnification of the projection optical system for the irradiation light. The detection light correcting optical element is provided between said reticle and said substrate and adapted for deflecting the detection optical path toward the peripheral part of an exposure area of said reticle, so as to correct, by a predetermined amount, the chromatic aberration of magnification of the projection optical system for the detection light.

53 Claims, 12 Drawing Sheets

ALIGNMENT DEVICE HAVING IRRADIATION AND DETECTION LIGHT CORRECTING OPTICAL ELEMENTS

BACKGROUND OF THE INVENTION

1. Field of the Invention

The present invention relates to an alignment device for a semiconductor exposure apparatus equipped with a projection optical system (projection lens) for transferring a pattern, formed on a recticle (mask), onto a wafer, and more particularly to an alignment device for relative positioning of the reticle and a substrate (wafer) by means of alignment light of a wavelength different from that of the exposure light for transferring the reticle pattern onto the substrate.

2. Related Background Art

Conventional alignment device for aligning the reticle and the wafer by detecting an alignment mark on the wafer through the projection objective lens is so designed to employ alignment light of a wavelength different from that of the exposure light, in order not to affect the photoresist coated on the wafer.

However, such alignment based on the alignment light of the wavelength different from that of the exposure light results in a drawback of chromatic aberration generated in the projection lens, and methods have been proposed, for example in the European Patent No. 393775A and in the U.S. Pat. No. 4,492,459, for correcting such chromatic aberration.

In the EP393775A, the chromatic aberration, resulting from the alignment light of the wavelength different from that of the exposing light, is corrected by positioning a correction lens on the optical axis at the entrance pupil of the projection lens, and the alignment is conducted by detecting ±1st-order diffraction light from the wafer mark.

Also in the U.S. Pat. No. 4,492,459, the chromatic aberration, generated when the alignment light passes through the projection lens, is corrected by a correction optical system positioned in or outside the exposing optical path between the reticle and the projection lens, and the alignment is conducted by detecting, through the projection lens, an image of the reticle mark formed on the wafer and the wafer mark.

In the configuration of the above-mentioned EP 393775A, the lens for correcting the chromatic aberration is positioned at the center of the entrance pupil of the projection lens, and is constructed so small as not to undesirably affect the exposing light.

However, this configuration involves a basic drawback that, though the improvement in precision of alignment requires a finer pitch of the diffraction grating constituting the wafer mark, such finer pitch of the diffraction grating expands the distance of the ±1st-order diffracted lights to be detected at the entrance pupil of the projection lens so that the correction lens cannot be made smaller in size. Consequently the correction lens becomes inevitably so large as to detrimentally affect the exposing light, and such configuration is unable to comply with the finer alignment.

Also the above-mentioned U.S. Pat. No. 4,492,459 allows, in principle, to correct the longitudinal chromatic aberration of the projection lens, by positioning a correction optical system in or outside the exposing optical path between the reticle and the projection lens.

However, when the image of the wafer mark is observed through the projection lens, because the alignment light is longer in wavelength than the exposing light, said image may enter the exposure area on the reticle due to the chromatic aberration of magnification. In such case, said image of wafer mark can be shifted from the exposure area by correcting the chromatic aberration of magnification with a parallel-faced flat plate of variable angle, positioned outside the exposing optical path between the reticle and the projection lens. However, such method is impractical because said parallel-faced flat plate intercepts a part of the exposing light.

Also in so-called through-the-reticle (TTR) system in which the alignment is conducted through the reticle and the projection lens, or in so-called through-the-lens (TTL) system in which the alignment is conducted through the projection lens, the light emerging from the alignment mark of the substrate (wafer) is taken out by a mirror positioned above or below the reticle, but said mirror may intercept a part of the exposing light so that the arrangement of the alignment optical system becomes difficult if the image of wafer mark tends to shift into the exposure area of the reticle by the chromatic aberration of magnification of the projection lens.

Furthermore, though the projection lens is generally well corrected for the chromatic aberrations (longitudinal chromatic aberration and chromatic aberration of magnification) for the light of exposing wavelength, the designing and manufacture of the projection lens become more difficult if it is to be corrected also for the chromatic aberrations for the alignment light of another wavelength.

Particularly, the projection lens employing an excimer laser as the exposure light source can only employ limited lens materials such as quartz and fluorite, and the adhesion of these material for correction of chromatic aberration is difficult due to the high intensity of the excimer laser. It is therefore difficult to achieve correction also for the chromatic aberration for the alignment light of a wavelength different from that of the exposing light, and the designing and manufacture of such projection lens have therefore been difficult.

The present invention, attained in consideration of the foregoing background, is to provide an alignment device capable of correcting the longitudinal chromatic aberration of the projection lens and simultaneously controlling the chromatic aberration of magnification, despite of a relatively simple configuration, thereby facilitating the positioning of the alignment optical system and rendering the designing and manufacture of the projection lens easier.

The chromatic aberration of magnification in the present invention means the lateral chromatic aberration and defines the aberration between the crossing positions, on the Gaussian image plane, of principal rays respectively of an off-axis light of a wavelength same as that of the exposing light, focused on said Gaussian image plane by passing through the projection lens, and of the alignment light of a wavelength different from that of the exposing light, focused on or in front of or behind said Gaussian image plane by passing through said projection lens. Also the amount T of the chromatic aberration of magnification (or lateral chromatic aberration) is defined by $\Delta T = \oplus \delta 2 - \delta 1 |$, wherein $\delta 1$ is the distance from the crossing position, on said Gaussian image plane, of the principal ray of the off-axis light of a wavelength same as that of the exposing light, focused on said Gaussian image plane by passing through the projection lens, to the optical axis position of the projection lens on said Gaussian image plane, while δ2 is the distance from the crossing position, on said Gaussian image plane, of the principal ray of the alignment light of a wavelength different from that of the exposing light, focused on or in front of or behind said Gaussian image plane by passing through said projection lens, to the optical axis position of the projection lens on said Gaussian image plane.

SUMMARY OF THE INVENTION

The above-mentioned object can be attained, according to an embodiment of the present invention, by an alignment device provided in an exposure apparatus equipped with a projection optical system for transferring a predetermined pattern, formed on a reticle, onto a substrate with an exposing light, and adapted to detect the position of an alignment mark formed on said substrate, comprising:

light irradiation means for irradiating said alignment mark with an alignment light of a wavelength different from that of said exposing light, through said projection optical system;

detection means for detecting the light, coming from said alignment mark, through said projection optical system;

an irradiating light correcting optical element positioned between said reticle and said substrate and adapted to deflect the irradiating optical path for correcting, respectively by predetermined amounts, the longitudinal chromatic aberration and the chromatic aberration of magnification of the projection optical system for the irradiating light; and a detected light correcting optical element positioned between said reticle and said substrate, and deflecting the detection optical path toward the peripheral part of the exposure area of said reticle, for correcting the chromatic aberration of magnification of the projection optical system for the detected light by a predetermined amount.

In another embodiment of the present invention, there is provided an alignment device provided in an exposure apparatus equipped with a projection optical system for transferring a predetermined pattern, formed on a reticle, onto a substrate by exposing light, and adapted to set the position of said substrate by detecting the position of a diffraction grating mark formed on said substrate, comprising:

light irradiation means for irradiating said diffraction grating mark through said projection optical system from two predetermined directions with two alignment light beams of a wavelength different from that of the exposing light, under a predetermined frequency difference;

detection means for detecting predetermined diffracted light beam from said diffraction grating mark through said projection optical system;

movement means for moving said substrate, based on a detection signal from said detection means;

an irradiation light correcting optical element provided in said projection optical system and adapted to deflect the irradiating optical path so as to correct, by predetermined amounts, the longitudinal chromatic aberration and the chromatic aberration of magnification induced by the projection optical system on said irradiating light; and a detection light correcting optical element provided in said projection optical system and adapted to deflect the detection optical path toward the peripheral part of the exposure area of said reticle so as to correct, by a predetermined amount, the chromatic aberration of magnification induced by the projection optical system on said detection light;

wherein said irradiation light correcting optical element and said detection light correcting optical element are provided in a plane perpendicular to the optical axis of said projection optical system.

In still another embodiment of the present invention, there is provided an alignment device, provided in an exposure apparatus equipped with a projection optical system for transferring a predetermined pattern, formed on a reticle, onto a substrate by exposure light and adapted for detecting the position of a diffraction grating mark formed on said substrate, comprising:

light irradiation means for irradiating said diffraction grating mark through said projection optical system with alignment light beams of a wavelength different from that of said exposure light;

detection means for detecting diffracted light from said diffraction grating mark through said projection optical system;

an irradiation light correcting optical element provided between said reticle and said substrate and adapted to deflect the irradiating optical path so as to correct, by a predetermined amount, the chromatic aberration of magnification induced by the projection optical system on said irradiating light; and a detection light correction optical element provided between said reticle and said substrate and adapted to deflect the detection optical path toward the peripheral part of the exposure area of said reticle, so as to correct, by predetermined amounts, the longitudinal chromatic aberration and the chromatic aberration of magnification induced by the projection optical system on said detection light.

The alignment device according to the above-mentioned embodiments of the present invention have following features.

In irradiating the alignment mark (diffraction grating) of the wafer with the alignment beams of a wavelength different from that of the exposure light through the projection lens and detecting the diffracted light from said alignment mark through the projection lens, there are generated the longitudinal chromatic aberration and the chromatic aberration of magnification. Therefore, according to the present invention, there are independently provided a first optical element for correcting the longitudinal chromatic aberration and controlling the chromatic aberration of magnification for either of the alignment light for irradiation and the alignment light for detection, and a second optical element for controlling the chromatic aberration of magnification for the other of said alignment lights.

As it is thus rendered possible to control the chromatic aberration of magnification, while controlling the longitudinal chromatic aberration of the projection lens on the alignment light beams, the projection lens need not, in principle, be corrected for the chromatic aberrations for the alignment light beams, so that the designing and manufacture of the projection lens are significantly facilitated. Besides, even if the projection lens contains the chromatic aberration of magnification, the positioning of the alignment optical system is made easier as the alignment optical path can be arbitrarily deflected to the outside of the exposure optical path.

Furthermore, in effecting alignment of higher precision by employing a finer pitch in the diffraction grating of the wafer mark, the detrimental effect on the exposure light can be avoided since the proportion of the above-mentioned correcting optical elements in the exposure optical path can be significantly reduced. It is therefore rendered possible to faithfully transfer fine patterns of the reticle onto the wafer.

As explained above, the present invention can provide an alignment device of high performance which, being capable of controlling the chromatic aberration of magnification of the projection lens while correcting the longitudinal chromatic aberration thereof with a relatively simple structure, facilitates the designing and manufacture of the projection lens and also the positioning of the alignment optical system.

Still other objects of the present invention, and the advantages thereof, will become fully apparent from the following detailed description, to be taken in conjunction with the attached drawings.

DESCRIPTION OF THE PREFERRED EMBODIMENTS

Figure 1:
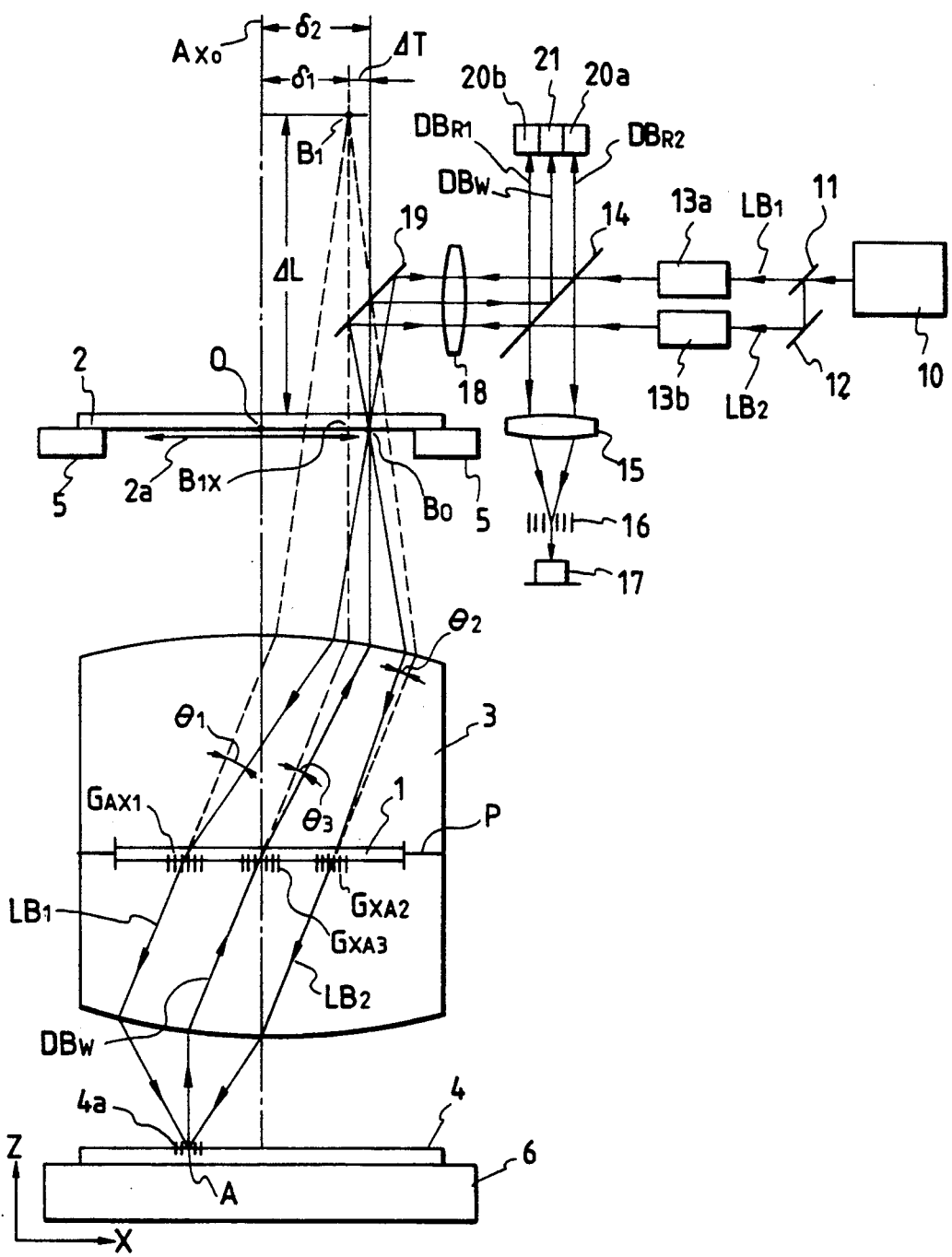
FIG. 1 is a schematic view of a first embodiment of the present invention.

In the following there will be explained a 1st embodiment of the present invention, with reference to FIG. 1.

A reticle (mask) 2 bearing a predetermined circuit pattern and a wafer (substrate) 4 are respectively supported by two-dimensionally movable stages 5, 6 in mutually conjugate arrangement with respect to a projection lens (projection objective lens) 1 under exposure light. Above the projection lens 1 there is provided an unrepresented illuminating optical system which uniformly illuminates the reticle 2 with exposure light, for example excimer laser light ($\lambda = 249$ nm: KrF or $\lambda = 193$ nm: ArF) whereby the circuit pattern on the reticle 2 is transferred onto the wafer.

The projection lens 1 is so constructed as to be telecentric at the reticle side and at the wafer side, and is sufficiently corrected for the chromatic aberration for the exposing excimer laser light.

On the reticle 2 and the wafer 4, there are respectively formed diffraction grating marks $RM_X$, $WM_X$ for alignment.

The wafer 4 is supported by suction on the stage 6 which moves two dimensionally by step-and-repeat method, and, after exposure of a shot area to the pattern of the reticle 2, is stepped to a next shot position. On the reticle stage 5 there are fixed unrepresented mirrors for reflecting laser beams from laser interferometers for detecting the position of the reticle 2 in the X, Y and rotational ($\theta$) directions in the horizontal plane. Said interferometers, though omitted from the illustration for the purpose of simplicity, have three laser beams for independent length measurements in the X, Y and $\theta$ directions. The moving stroke of the reticle stage 5 is within several millimeters, and the resolving power of the interferometers is designed, for example, as about 0.01 $\mu$m.

Also on a part of the wafer stage 6 there are fixed mirrors for reflecting laser beams from interferometers for detecting the position of the wafer 4 in the X and Y directions. Said interferometers have two laser beams for independently detecting the positions in the X- and Y-directions, but they are omitted from the illustration for the purpose of simplicity. The reticle stage 5 is driven in the X, Y and $\theta$ directions by unrepresented driving motors (driving system), and the two-dimensional movement of the wafer stage 6 is conducted by driving motors (driving system) independent from the driving motors for the reticle stage 6.

Unrepresented servo control systems are provided for controlling the driving systems for the stages 5, 6, based on the positional information from the interference systems provided in the stages 5, 6.

In the following there will be given an explanation on the alignment system of the exposure apparatus shown in FIG. 1. An alignment light beam emitted from a laser unit 10 of a wavelength different from that of the exposure light, for example a light beam of 633 nm from an He-Ne laser, is split into light beams $LB_1$, $LB_2$ by a half mirror 11 serving as a light path splitting member.

The light beam $LB_1$, transmitted by the half mirror 11 is transmitted by a first acoustooptical element (AOM) 13a serving as a first optical modulator, while the light beam $LB_2$, reflected by the half mirror 11 is transmitted by a second acoustooptical element (AOM) 13b serving as a second optical modulator.

The AOM 13a is driven with a high-frequency signal of a frequency $f_1$, while the AOM 13b is driven with a high-frequency signal of a frequency $f_2$ $(=f_1-\Delta f)$, wherein the driving frequencies $f_1$, $f_2$ and the frequency difference $\Delta f$ preferably satisfy relation $f_1 >> \Delta f$ and $f_2 >> \Delta f$, and the upper limit of $\Delta f$ is defined by the response of the alignment photodetectors to be explained later.

The light beams $LB_1$, $LB_2$ transmitted by the AOM's 13a, 13b are respectively split by a half mirror 14 into transmitted light beams and reflected light beams, and the light beams $LB_1$, $LB_2$ reflected by said half mirror 14 are condensed by a condenser lens 15. At the focal position of said condenser lens 15, there is provided a reference diffraction grating 16 pitched along the plane of drawing, on which flowing interference fringes are formed by the two light beams $LB_1$, $LB_2$ with a frequency difference $\Delta f$. The diffracted light transmitted by the diffraction grating 16 is detected by a photodetector 17. The reference signal thus detected is a sinusiodal AC signal (light beat signal) corresponding to the period of intensity change of the flowing interference fringes formed on the diffraction grating 16.

On the other hand, the two light beams $LB_1$, $LB_2$ transmitted by the half mirror 14 are guided through an alignment objective lens 18 and a mirror 19 and are focused on a reticle mark $RM_X$ formed outside the exposure area of a reticle 2, whereby, on said reticle mark $RM_x$, there are formed flowing interference fringes by the frequency difference $\Delta f$ of the light beams $LB_1$, $LB_2$.

Figure 2:
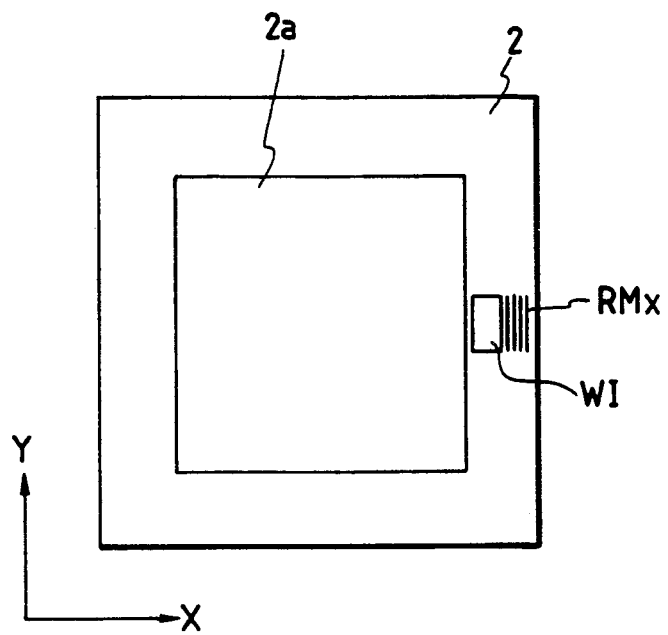
FIG. 2 is a plan view of a reticle in said first embodiment.

As shown in FIG. 2, the reticle mark $RM_X$ is composed of a diffraction grating positioned outside the exposure area 2a of the reticle 2 and is pitched in the X-direction (direction of measurement). Adjacent to said reticle mark $RM_X$ formed is a transparent window (reticle window) WI.

Consequently the light beams $LB_1$, $LB_2$ focused on the reticle by the objective lens 18 of the alignment system illuminate, with a predetermined crossing angle, not only the reticle mark $RM_X$ but also the reticle window WI.

Figure 3:
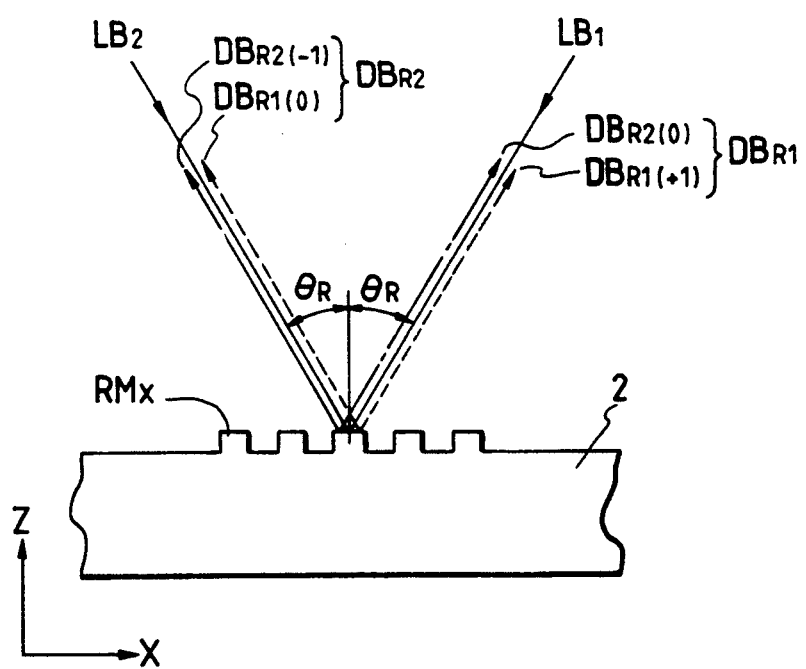
FIG. 3 is a view showing diffracted light generation when a reticle mark of the first embodiment is irradiated with light beams.

Now reference is made to FIG. 3 for further explaining the light beams $LB_1$, $LB_2$ illuminating the reticle mark $RM_X$ with a predetermined crossing angle. As the light beam $LB_1$ irradiates the reticle mark $RM_X$ in slanted manner, a 0-th order light beam $DB_{R1}(0)$ is generated in a direction opposite to the incident direction of the light beam $LB_2$ (in the normal reflecting direction) as indicated by a broken line, and a 1st-order light beam $DB_{R1}(+1)$ is generated in a direction opposite to the incident direction of the light beam $LB_1$, as indicated by a broken line.

Also as the light beam $LB_1$ irradiates the reticle mark $RM_X$ in slanted manner, a 0-th order light beam $DB_{R2}(0)$ is generated, as indicated by a chain line, in a direction opposite to the incident direction of the light beam $LB_1$ (normal reflecting direction), and a $-1$st-order light beam $DB_{R2}(-1)$ is generated, as indicated by a chain line, in a direction opposite to the incident direction of the light beam $LB_2$. The pitch PR of the reticle mark $RM_X$ is so selected as to satisfy a relationship $\sin 2\theta_R = \lambda/P_R$, wherein $\lambda$ is the wavelength of the alignment light, and $2\theta_R$ is the crossing angle of the irradiation light beams $LB_1$, $LB_2$. In FIGS. 1 and 3, the 0-th order light $DB_{R2}(0)$ and the +1st-order light $DB_{R1}(+1)$ are indicated as the detection light beam $DB_{R1}$, while the 0-th order light $DB_{R1}(0)$ and the $-1$st-order light $DB_{R2}(-1)$ are indicated as the detection light beam $DB_{R2}$.

Referring again to FIG. 1, the detection light $DB_{R1}$ (=1st-order light $LB_{R1}(+1)$ and 0-th order light $LB_{R2}(0)$), proceeding inversely along the path of the light beam $LB_1$, is again guided through the mirror 19, objective lens 18 and half mirror 14 and reaches a photodetector 20a, which is positioned conjugate with the pupil of the objective lens 18 and which detects the position signal (light beat signal) from the reticle mark $RM_X$. At the same time, the detection light $DB_{R2}$ (=$-1$st-order light $LB_{R2}(-1)$ and 0-th order light $DB_{R1}(0)$), proceeding inversely along the path of the light beam $LB_2$, is guided through the mirror 19, objective lens 18 and half mirror 14 and reaches a photodetector 20b, which is positioned conjugate with the pupil of the objective lens 18 and which detects the position signal (light beat signal) from the reticle mark $RM_X$. The position signals of the reticle 2, detected by the photodetectors 20a, 20b are sinusoidal AC signals (light beat signals) corresponding to the period of intensity changes of the interference fringes flowing on the reticle mark $RM_X$.

The light beams $LB_1$, $LB_2$ irradiating, with a predetermined crossing angle $\theta_R$, the reticle window WI adjacent to the reticle mark $RM_X$ are transmitted by said window WI and enter a projection lens 3 from an off-axis position.

Figure 4:
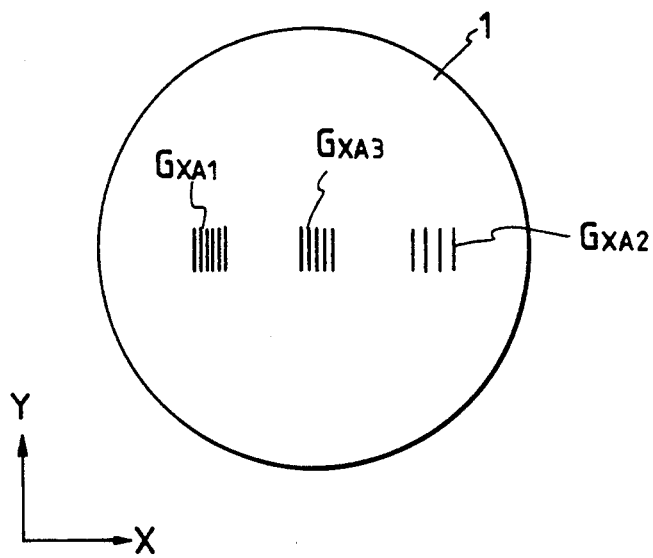
FIG. 4 is a plan view of diffraction gratings formed on the pupil plane of a projection lens of the first embodiment of the present invention.

Said projection lens 3 is sufficiently corrected for the chromatic aberration for the exposure light, but not for the alignment light different in wavelength from the exposure light. Therefore, on the incident pupil plane P of the projection lens 3, there is provided a transparent circular substrate 1 bearing three diffraction gratings (correcting optical elements) $G_{XA1}$-$G_{XA3}$ of mutually different pitches, arranged along the measurement direction (X-direction) passing through the center of the optical axis of the projection lens 3, as shown in FIG. 4. The diffraction grating $G_{XA3}$ is positioned on the optical axis $A_{X0}$ of the projection lens 3, while the diffraction gratings $G_{XA1}$, $G_{XA2}$ are positioned laterally symmetrically with respect to the diffraction grating $G_{XA3}$ (or the optical axis of the projection lens 3), and said diffraction gratings $G_{XA2}$, $G_{XA3}$, $G_{XA1}$ have the pitches increasing in this order. The detailed structure and function of said diffraction gratings in the present embodiment will be explained later in more detail.

Figure 5:
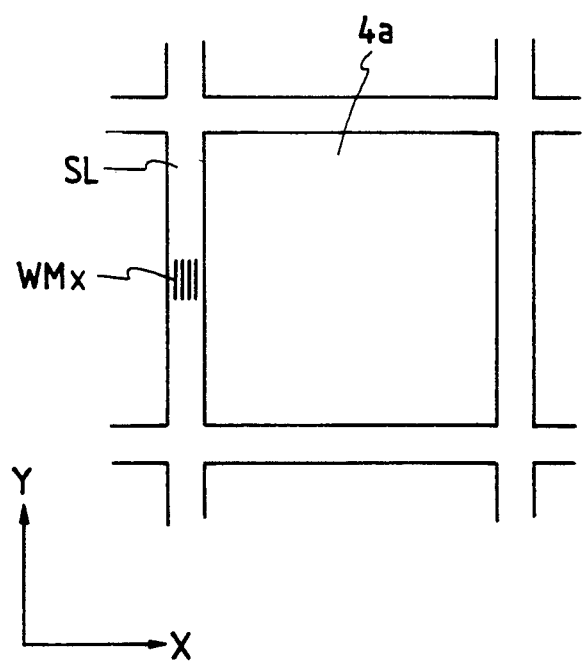
FIG. 5 is a view showing diffracted light generation when a wafer mark of the first embodiment is irradiated with light beams.

Again referring to FIG. 1, the irradiation light beams $LB_1$, $LB_2$ which enter the projection lens 3 from the off-axis position thereof and reach the incident pupil thereof, are respectively deflected (diffracted) by the diffraction gratings (irradiation light correcting optical elements) $G_{XA1}$ and $G_{XA2}$, by correction angles $\theta_1$, $\theta_2$, and irradiate a wafer mark $WM_X$, formed on a wafer 4 from two directions with a predetermined crossing angle, whereby flowing interference fringes are formed on said wafer mark $WM_X$. Said wafer mark $WM_X$ is composed, as shown in FIG. 5, of a diffraction grating positioned in a street line SL outside a shot area 4a and pitched in the X-direction (direction of measurement).

Figure 6:
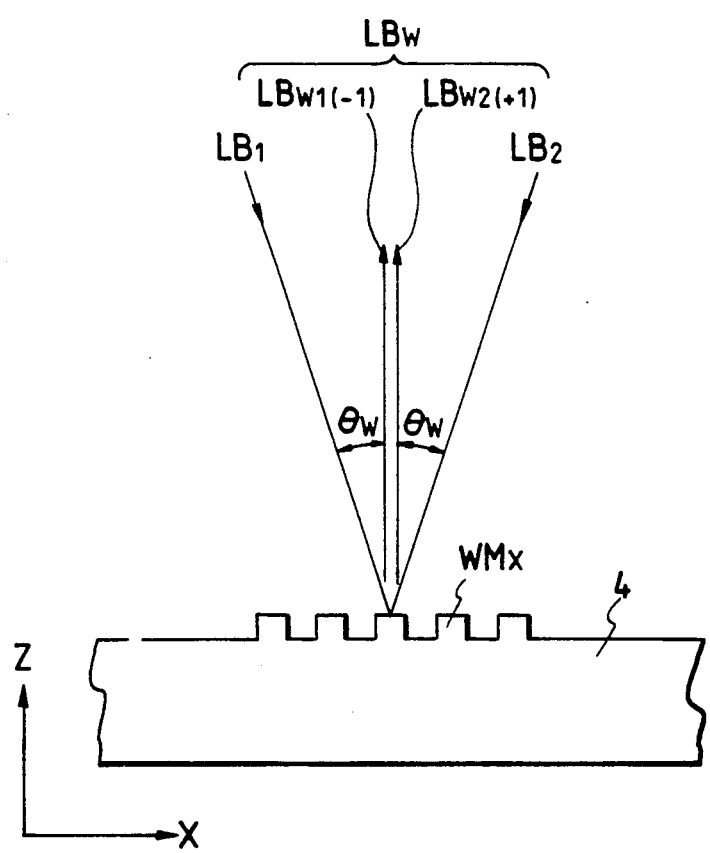
FIG. 6 is a plan view of a shot area on the wafer to be exposed by the reticle of the first embodiment of the present invention.

As the irradiation light beams $LB_1$, $LB_2$ irradiate the wafer mark $WM_X$ with a predetermined crossing angle as shown in FIG. 6, a $-1$st-order light $LB_{W1}(-1)$ of the irradiation light beam $LB_1$ and a $+1$st-order light $LB_{W2}(+1)$ of the irradiation light beam $LB_2$ are generated in a direction perpendicular to the wafer 4, or parallel to the optical axis of the projection lens 3.

The pitch PW of the wafer mark $WM_X$ is so selected as to satisfy a relationship $\sin\theta_W = \lambda/P_W$, wherein $\lambda$ is the wavelength of the alignment light, and $2\theta_W$ is the crossing angle of the irradiation light beams $LB_1$, $LB_2$. In FIGS. 1 and 6, the $-1$st order-light $DB_{W1}(-1)$ and the $+1$st-order light $DB_{W2}(+1)$ are collectively illustrated as the detection light $DB_W$.

Again referring to FIG. 1, the detection light beam $DB_W$ ($-1$st-order light beam $LB_{W1}(-1)$ and $+1$st-order light beam $LB_{W2}(+1)$) generated perpendicularly to the wafer mark $WM_X$ proceeds along the path of the principal ray of the projection lens 3, then deflected by a correction angle $\theta_3$ by the diffraction grating $G_{XA3}$ (detection light correction optical element) provided at the center of the pupil P of the projection lens 6, further guided through the reticle window WI, mirror 19, objective lens 18 and half mirror 14 and reaches a photodetector 21. Like the photodetectors 20a, 20b mentioned above, the photodetector 21 is positioned conjugate with the pupil of the objective lens 18 or the projection lens 3.

In the basic configuration of the 1st embodiment explained above, the photodetector 17 detects a reference signal, while the photodetectors 20a, 20b detect a reticle position signal containing the positional information of the reticle 2, and the photodetector 21 detects a wafer position signal containing the positional information of the wafer 4.

In the following there will be explained the relative alignment of the reticle 2 and the wafer 4. Using the photoelectric (sinusoidal AC) signal from the photodetector 17 as a reference signal, an unrepresented phase detecting system detects the phase difference $\phi_r$ of the photoelectric (sinusoidal AC) signal obtained by the photodetectors 20a, 20b from the diffracted light beams from the reticle mark $RM_X$. Similarly the phase detecting system detects the phase difference $\phi_w$ between said reference signal and the photoelectric signal, obtained by the photodetector 21 from the diffracted light beam from the wafer mark $WM_X$. The aberration between the reticle 2 and the wafer 4 in the X-direction can be determined from the difference of $\phi_r$ and $\phi_w$. This determination method is called optical heterodyne method, and is suitable for effecting closed-loop servo control in order to avoid minute positional aberration during the exposure of the photoresist on the wafer 4 to the pattern of the reticle 2, since the positional aberration between the reticle 2 and the wafer 4 can be determined with a high resolving power even when they are stopped, as long as said positional aberration is within a pitch of the reticle mark and within a half pitch of the wafer mark. In this determination system, after the alignment is completed by moving the reticle 2 or the wafer 4 so as to bring $\phi_4 - \phi_w$ to zero (or a predetermined value), a servo lock can be applied so as to maintain the reticle 2 and the wafer 4 in thus aligned relative position.

In the present embodiment, the movement of the wafer stage 6 to each shot area on the wafer at the step-and-repeat exposures is conducted according to the measured results of the interferometer system, and, once the wafer mark $WM_X$ is positioned within a precision of $\pm\frac{1}{2}$ pitch, in the irradiation area of the light beams $LB_1$, $LB_2$, the reticle stage 5 or the wafer stage 6 can be servo controlled by an unrepresented servo system, based solely on the information from the unrepresented phase detection system. A DC motor may be employed for driving the reticle stage 5 or the wafer stage 6, and an analog voltage generated for example by a D/A converter, corresponding to the phase difference $\phi_r - \phi_w$ may be directly given to a servo circuit of said DC motor. Said servo control is continued until the end of exposure of said shot area.

Such servo control, not relying on the measurement of the interferometer, can reduce small fluctuations of the stage, resulting for example from the fluctuation in the air density in the beam path of the interferometer. For this purpose, when the phase difference information enabling servo control is obtained from the unrepresented phase detection system, the measured value of the interferometer of the wafer stage is disconnected from the servo control system of the wafer stage thereby bringing the voltage applied to the motor for the wafer stage 6 to zero, and the above-mentioned analog voltage is applied to the servo control system of the reticle stage.

In this manner the small fluctuations generated particularly in the wafer stage during the exposure operation are suppressed and are replaced by slow drifting movements, and the relative positional aberration between the reticle and the wafer can be maintained almost zero by high-speed following movement of the reticle stage 5. Consequently the exposed pattern is free from thickening of the pattern line width or deterioration of resolving power, and extremely faithful pattern transfer can be realized.

The two interference beat signals obtained from the photoelectric detectors 20a, 20b are same in the nature of signal, and either may be supplied to the unrepresented phase detection system. However, since the optical information from the reticle in the present invention is produced by the interference between the 0-th and 1st order diffracted beams of the light beams $LB_1$, $LB_2$, there may result an offset if said 1st and 0-th order beams are significantly different in intensity. The phase difference with respect to the reference signal from the photodetector 17 is preferably calculated after said two signals from the photodetectors 20a, 20b are supplied through an analog circuit for calculating the sum (or difference) of said two signals. Naturally the system may be made switchable for using either of the two signals from the photodetectors 20a, 20b, or a signal synthesized from said two signals.

In the following there will be explained the specific structure and function of the diffraction gratins (correcting optical elements) $G_{XA1} - G_{XA3}$ which are characteristic features of the first embodiment of the present invention.

As shown in FIG. 1, the diffraction gratings $G_{XA1} - G_{XA3}$ are arranged along the direction measurement (X-direction) at the pupil of the projection lens 3, but there will be considered, in the following, a case where said diffraction gratings are not present.

Though the projection lens 3 is corrected for the chromatic aberration at the wavelength of the exposing light, but is not corrected for the chromatic aberration for the alignment light of a wavelength different from that of the exposing light from the laser light source 10. For this reason, when the light beams $LB_1$, $LB_2$ irradiate, with a predetermined crossing angle, a position A on the wafer mark $WM_X$, the rays inversely proceeding along the paths of said beams $LB_1$, $LB_2$ and the rays proceeding along the path of the detection (diffracted) beam $DB_W$, obtained from said light beams $LB_1$, $LB_2$, proceed along the broken lines because of the chromatic aberration of the projection lens 3 and mutually cross at a point $B_1$ above the reticle 2. In this state, in comparison with the focal position B0 in case the alignment light has a same wavelength as that of the exposing light, there are generated a longitudinal chromatic aberration $\Delta L$ in the projection lens 3 in the Z-direction (axial direction of said lens 3) and a chromatic aberration $\Delta T$ of magnification in the X-direction (perpendicular to the optical axis $A_{X0}$ of the projection lens 3) toward the exposure area.

Said chromatic aberration $\Delta T$ of magnification (lateral chromatic aberration) is defined by $\Delta T = |\delta_1 - \delta_2|$, wherein, as shown in FIG. 1, $\delta_1$ is the distance from the crossing point B0, on the Gaussian image plane (reticle 2), of the principal ray of the off-axis light beam which has the same wavelength as that of the exposing light and is focused on said Gaussian image plane by passing through the projection lens 3, to the optical axis position of said projection lens 3 on said Gaussian image plane, and $\delta_2$ is the distance from the crossing point $B_{1X}$, on said Gaussian image plane (reticle 2), of the principal ray of the alignment light beam which has a wavelength different from that of the exposure light and is focused in front of or behind said Gaussian image plane by passing through said projection lens 3, to said optical axis position o.

Thus, because of such longitudinal chromatic aberration, the vibration or inclination of the alignment optical system leads to a significant detection error, thereby hindering precise and stable alignment, and necessitating to enlarge the reticle window WI positioned adjacent to the reticle mark $RM_X$. Also since the focus position $B_1$ in the presence of said chromatic aberration of magnification is shifted by $\Delta T$ to the left (toward the exposure area) in comparison with the focus position $B_0$ of the alignment light beam of the same wavelength as that of the exposure light, said focus position $B_1$ enters the exposure area of the reticle 2 when it is viewed from above. It therefore becomes difficult to obtain the alignment light beam from the wafer mark $WM_X$.

In order to overcome the above-mentioned difficulties, the 1st embodiment of the present invention is provided, on the entrance pupil plane of the projection lens and symmetrically to the center thereof, with diffraction gratings (irradiation light correcting optical elements) $G_{XA1}$, $G_{XA2}$ capable of simultaneously correcting the longitudinal chromatic aberration $\Delta L$ and the chromatic aberration $\Delta T$ of magnification for irradiation light beams $LB_1$, $LB_2$. Said diffraction gratings $LB_1$, $LB_2$ have mutually different pitches, so that the irradiating light beams $LB_1$ proceeding toward the wafer mark $WM_X$ is deflected by a correction angle $\theta_1$ by diffraction by the grating $G_{XA1}$ while the irradiating light beam $LB_2$ proceeding also toward the wafer mark $WM_X$ is deflected by a correction angle $\theta_2$ by diffraction by the grating $G_{XA2}$, wherein $\theta_2 < \theta_1$.

Because of said optical path correction, the irradiation light beams $LB_1$, $LB_2$ mutually cross with the predetermined crossing angle, not only on the reticle window WI but also on the wafer mark $WM_X$, whereby the reticle 2 and the wafer 4 remain in the conjugate relationship with respect to the projection lens 3, also for the irradiation light beams $LB_1$, $LB_2$ of a wavelength different from that of the exposure light.

Also there is provided, at the center of the pupil plane P of the projection lens 3, a diffraction grating (detection light correcting optical element) $G_{XA3}$ for correcting the chromatic aberration $\Delta T$ of magnification for the detection light beam $DB_W$ diffracted from the wafer mark $WM_X$, whereby the detection light beam $DB_W$ proceeding from the wafer mark $WM_X$ toward the reticle window WI along the path of the principal ray of the projection lens 3 is deflected by a correction angle $\theta_3$ by the diffraction of the diffraction grating $G_{XA3}$. Because of said optical path correction, the detection light beam $DB_W$ perpendicularly enters the reticle window WI while being maintained in the telecentric state, then passes through the crossing point of the irradiation light beams $LB_1$, $LB_2$ at the reticle window WI, proceeds along the optical axis of the alignment objective lens 19 and finally reaches the photoelectric detector 21. The above-mentioned correction angles satisfy a relation $\theta_2 < \theta_3 < \theta_1$.

As explained in the foregoing, the diffraction gratings $G_{XA1}$–$G_{XA3}$, serving as correcting optical elements, respectively deflect the optical paths of the alignment light beams by correction angles $\theta_1$, $\theta_2$, $\theta_3$ by diffracting function thereof, so as to satisfactorily correct the chromatic aberrations (longitudinal chromatic aberration and chromatic aberration of magnification) of the projection lens 3. Since this configuration can resolve the drawback associated with the longitudinal chromatic aberration of the projection lens 3 and the drawback of intrusion of the alignment light beam into the exposure area of the reticle 2 resulting from the chromatic aberration of magnification, there can be provided an alignment device of high performance.

The above-mentioned correction angles and the pitches $P_{XA1}$, $P_{XA2}$, $P_{XA3}$ of the diffraction gratings $G_{XA1}$, $G_{XA2}$, $G_{XA3}$ satisfy following relationships:

$$P_{XA1} = m_1 \lambda_a / \sin\theta_1 \tag{1}$$

$$P_{XA2} = m_2 \lambda_a / \sin\theta_2 \tag{2}$$

$$P_{XA3} = m_3 \lambda_a / \sin\theta_2 \tag{3}$$

wherein $\lambda_a$ is the wavelength of the alignment light beam, and $m_n$ is the order of diffraction of the light beam at the respective diffraction grating, said $m_n$ in the present embodiment being $m_1$–$m_3$ and integers.

As will be apparent from FIG. 1, the correction angles $\theta_1$, $\theta_2$, $\theta_3$ by the diffraction gratings satisfy a relation $\theta_2 < \theta_3 < \theta_1$, so that the pitches of said gratings satisfy a relation $P_{XA2} > P_{XA3} > P_{XA1}$, that based on the equations (1)–(3). Thus, in the present embodiment, the grating pitch becomes finer in the order of the diffraction gratings $G_{XA2}$, $G_{XA3}$ and $G_{XA1}$.

The diffraction gratings $G_{XA1}$–$G_{XA3}$, formed as the correcting optical elements on a transparent circular substrate 1, are constructed as phase diffraction gratings by etching said substrate 1 for example of quartz. In order to improve the diffraction efficiency of the m-th order diffraction serving for deflecting the alignment optical path, the step d of said phase diffraction grating is preferably so constructed as to satisfy:

$$d = [(2m+1)\lambda_a]/[2(n_a - 1)] \tag{4}$$

wherein $\lambda_a$ is the wavelength of the alignment light beam, $n_a$ is the refractive index of the substrate at the wavelength of the alignment light beam, and m is an integer.

In this case, the diffraction gratings, having the diffracting function also on the exposure light, may undesirably affect the imaging performance of the projection lens 3. For this reason, on the diffraction gratings, there is preferably provided, for example by evaporation, a thin film with wavelength selecting ability, for reflecting the exposure light and transmitting the alignment light.

Also for bringing the diffraction efficiency for the exposure light to substantially zero at a certain sacrifice of the diffraction efficiency for the alignment light beam, the step d of the phase diffraction gratings is preferably so selected as to satisfy a relation:

$$d = m\lambda_e/(n_e - 1) \tag{5}$$

wherein $\lambda_e$ is the wavelength of the exposure light, $n_e$ is the refractive index of the substrate for the exposure light, and m is an integer.

As explained in the foregoing, in the 1st embodiment of the present invention, diffraction gratings $G_{XA1}$, $G_{XA2}$ for correcting the longitudinal chromatic aberration and the chromatic aberration of magnification of the projection lens 3 for the irradiation light beams $LB_1$, $LB_2$ irradiating the wafer mark $WM_X$ from two directions, and a diffraction grating $G_{XA3}$ for correcting the chromatic aberration of magnification of the projection lens 3 for the detection light beam $DB_W$ coming from the wafer mark $WM_X$, are separately positioned on a same plane at or in the vicinity of the pupil of the projection lens 3.

Consequently, even when the position of the wafer mark $WM_X$ is moved for reformation in the Y-direction, perpendicular to the measuring (X) direction and the alignment optical system is accordingly moved in said Y-direction, or when the position of the reticle mark $RM_X$ and the reticle window WI varies in the X-direction because of a difference in the exposure area on the reticle, it is in principle possible to maintain the irradiation light beams $LB_1$, $LB_2$ for alignment and the detection light beam $DB_W$ from the wafer mark $WM_X$ at constant passing positions on the entrance pupil plane of the projection lens 3. Thus the correcting optical elements $G_{XA1}-G_{XA3}$ of the present embodiment can satisfactorily enable the reformation of the wafer mark $WM_X$ and cover the reticles of different sizes.

Also the diffraction gratings $G_{XA1}-G_{XA3}$, serving as the correcting optical elements, only need to be present in the passing positions of the irradiation light beams $LB_1$, $LB_2$ and the detection light beam $DB_W$ on the pupil plane of the projection lens. Consequently said diffraction gratings can be made so small, in principle, in such a proportion on said pupil plane, that the influence on the exposure light is negligibly small.

In case the pitch of the wafer mark (diffraction grating) $WM_X$ is made finer for improving the precision of the alignment, there is required a larger crossing angle for the irradiation light beams $LB_1$, $LB_2$ at the reticle mark $RM_X$ and the wafer mark $WM_X$. In such case, said crossing angle can be made variable by positioning parallel-faced flat plates with variable angle, respectively in the optical path of the light beam $LB_1$ between the objective lens 18 and the AOM 13a in the alignment optical system and in the optical path of the light beam LB between said objective lens 18 and the AOM 18b, and suitably varying the angle of said flat plates. In such configuration, since the passing positions of the light beams $LB_1$, $LB_2$ on the pupil plane P of the projection lens 3 vary in the X-direction shown in FIG. 1, another circular substrate with correspondingly positioned correcting optical elements may be prepared as replacement.

The foregoing description has been limited to the alignment in the X-direction for the purpose of simplicity, but the alignment in the Y-direction is also naturally possible by forming a reticle mark pitched in the Y-direction and an adjoining reticle window in a non-exposure area adjacent to the non-exposure area containing the reticle mark $RM_X$ and the reticle window WI, and providing thereabove a corresponding second alignment optical system. In such case there are provided, along the Y-direction, diffraction gratings similar to those $G_{XA1}-G_{XA3}$ explained above.

Furthermore, in each of the diffraction gratings $G_{XA1}-G_{XA3}$ respectively provided for the irradiation light beams $LB_1$, $LB_2$ and the detection light beam $DB_W$, the pitch may be gradually varied in the direction of pitch so as to focus each of said light beam at a position conjugate with the reticle. Such configuration may also be employed in the following embodiments.

Figure 7A:
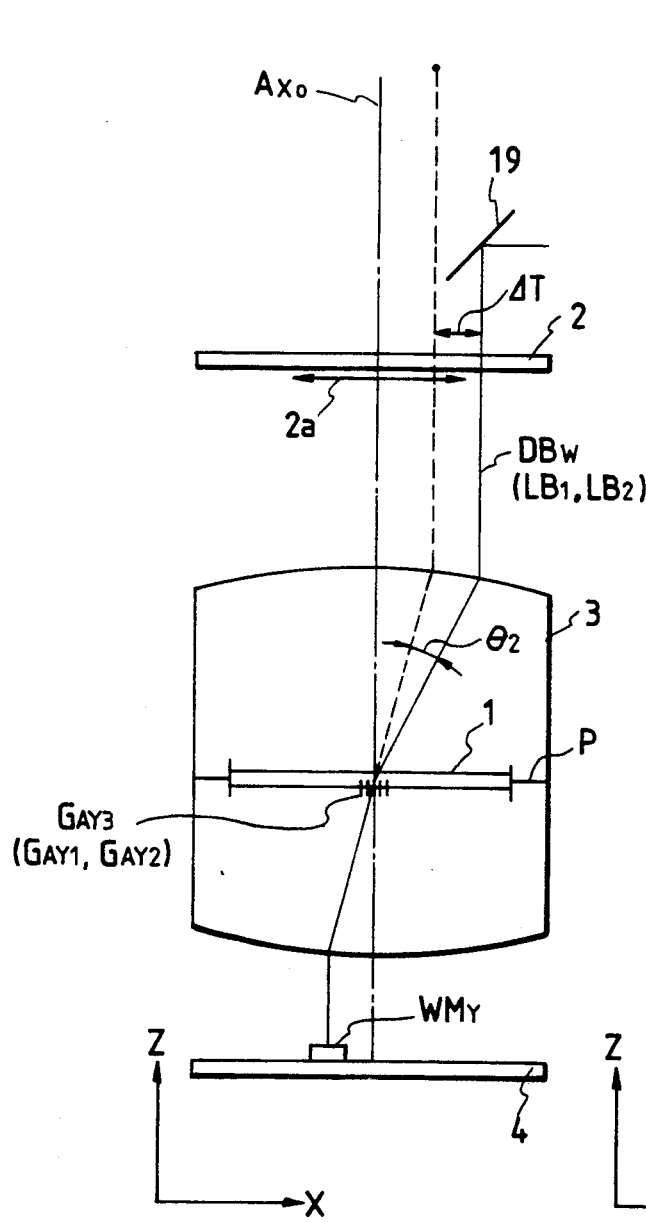
FIGS. 7A and 7B are schematic views of a 2nd embodiment of the present invention.
Figure 7B:
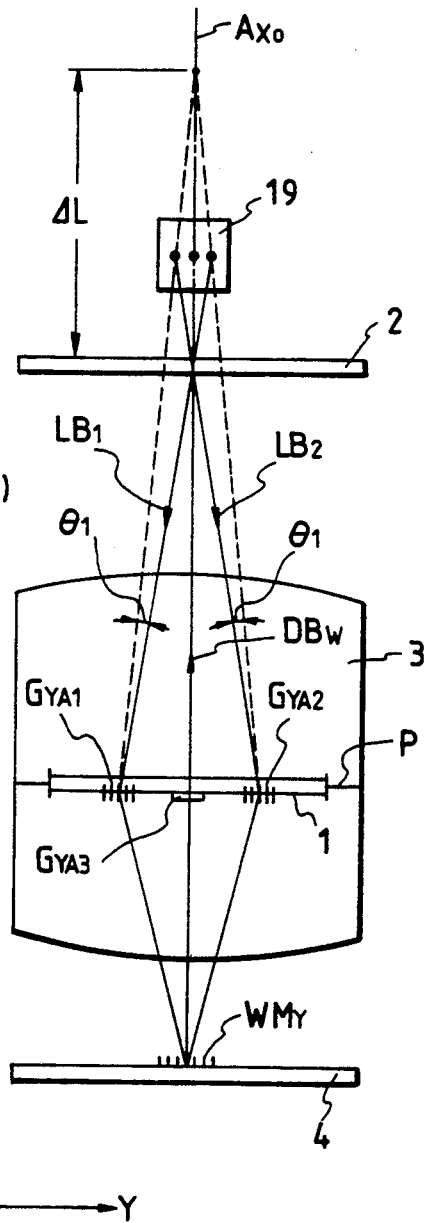

In the following there will be explained a 2nd embodiment of the present invention with reference to FIGS. 7A and 7B. In FIGS. 7A to 10, components equivalent in function to those in the 1st embodiment are represented by same symbols. FIG. 7A shows the state of alignment light beams through the projection lens 3, when it is observed from the side of X-Z plane, parallel to the X-direction (meridional direction), while FIG. 7B shows the state when observed from a direction perpendicular to the direction of FIG. 7A, namely from the side of Y-Z plane parallel to the measuring (Y) direction.

Figure 8:
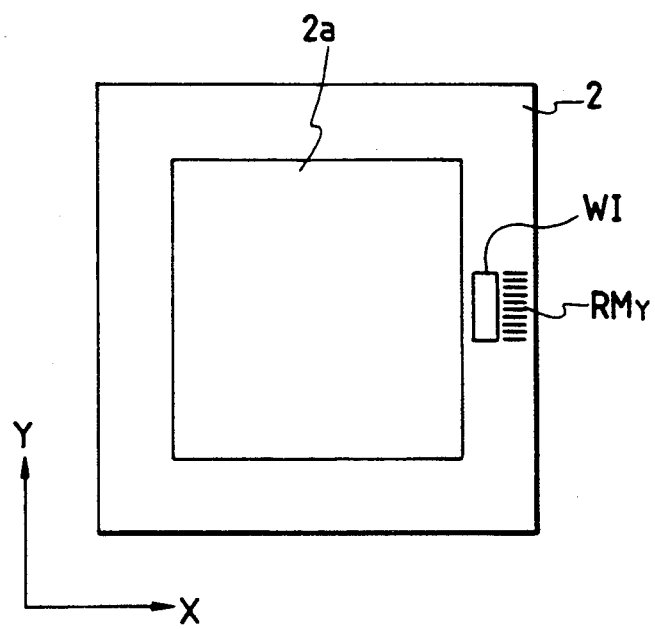
FIG. 8 is a plan view of a reticle of the 2nd embodiment of the present invention.
Figure 9:
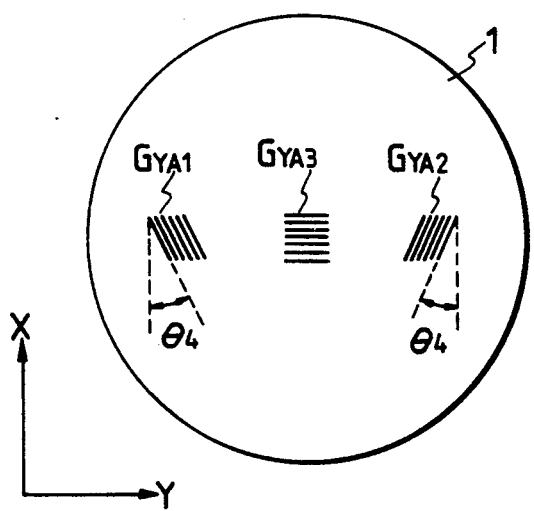
FIG. 9 is a plan view of diffraction gratings formed on the pupil plane of the projection lens of the 2nd embodiment of the present invention.

In the 2nd embodiment, the reticle mark (diffraction grating) $RM_Y$ and the adjacent reticle window WI are provided, as shown in FIG. 8, outside the exposure area 2a in the same manner as in the 1st embodiment, but the reticle mark $RM_Y$ is pitched in the Y-direction. In this embodiment, the measurement is conducted in the Y-direction.

Above the reticle 2, there is provided an unrepresented alignment optical system, similar to that in the 1st embodiment, for irradiating and detecting the reticle mark $RM_Y$ and the wafer mark $WM_Y$. Also, at the entrance pupil of the projection lens there is provided a transparent circular substrate 1 bearing diffraction gratings $G_{YA1}$, $G_{YA2}$, $G_{YA3}$ functioning as correcting optical elements. The diffraction gratings $G_{YA1}$, $G_{YA2}$ serving as the irradiation light correcting optical elements, are formed along the measuring (Y) direction, while the diffraction grating $G_{YA3}$, serving as the detection light correcting optical element is formed at the center of the pupil and is pitched in the non-measuring (X) direction.

The irradiation of the reticle mark $RM_Y$ and the wafer mark $WM_Y$ and the detection of the light diffracted therefrom are conducted in a similar manner as in the 1st embodiment and will not, therefore, be explained further.

Figure 10:
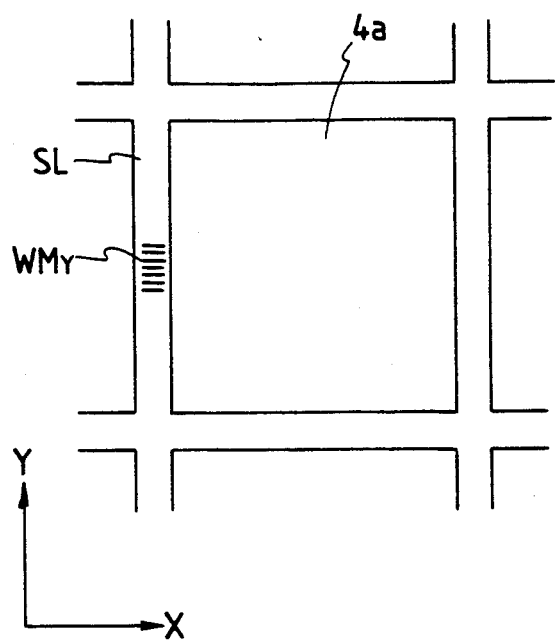
FIG. 10 is a plan view of a shot area on the wafer to be exposed by the reticle of the 2nd embodiment of the present invention.

In the present embodiment, as shown in FIGS. 7A and 7B, when the irradiation light beams $LB_1$, $LB_2$ from the alignment optical system irradiate the reticle window WI from two directions with a predetermined crossing angle therebetween, they are deflected in mutually opposite directions by an angle $\theta_1$, by the diffraction by the gratings $G_{YA1}$, $G_{YA2}$ formed on the pupil plane of the projection lens 3, thereby irradiating the wafer mark $WM_Y$ from two predetermined directions. The wafer mark $WM_Y$ is formed, as shown in FIG. 10, on a street line SL outside a shot area 4a on the wafer 1 and is pitched in the Y-direction in order to measure the position of the wafer 4 in the Y-direction.

Again referring to FIGS. 7A and 7B, the diffracted light beam $DB_W$ generated perpendicularly to the wafer mark $WM_Y$ proceeds through the diffraction grating $G_{YA3}$ formed at the center of the pupil of the projection lens and the reticle window WI, and reaches the unrepresented alignment optical system.

On the other hand, in a direction shown in FIG. 7A, perpendicular to the direction shown in FIG. 7B, the two irradiation light beams $LB_1$, $LB_2$ from the alignment optical system enter the projection lens 3 from an off-axis position as if they proceed along a same optical path and reach the center of the pupil plane P of the projection lens 3. As the diffraction gratings $G_{YA1}$, $G_{YA2}$ m $G_{YA3}$ are provided at this position along the measuring (Y) direction, they appear mutually superposed in FIG. 7A. Said light beams $LB_1$, $LB_2$ are respectively deflected by a correction angle $\theta_2$ by the diffraction gratings $G_{YA1}$, $G_{YA2}$ and perpendicularly irradiate the wafer mark $WM_Y$ provided at an off-axis position. The detection light beam $DB_W$, generated perpendicularly from the wafer mark $WM_Y$, is again deflected by the correction angle $\theta_2$ by the diffraction grating $G_{YA3}$ formed at the center of the pupil plane of the projection lens, and reaches the unrepresented alignment optical system through the reticle window WI.

As explained above, the diffraction gratings $G_{YA1}$, $G_{YA2}$ functioning as the irradiation light correcting optical elements serve to deflect the irradiation light beams $LB_1$, $LB_2$ by a correction angle $\theta_1$ when observed on the Y-Z plane parallel to the measuring (Y) direction, and to deflect said beams by a correction angle $\theta_2$ when observed on the perpendicular X-Z plane. Stated differently, the diffraction gratings $G_{YA1}$, $G_{YA2}$ deflect the irradiation light beams $LB_1$, $LB_2$ by the correction angle $\theta_1$ along the Y (measuring) direction in order to correct the longitudinal chromatic aberration $\Delta L$ of the projection lens 3, and also deflect said beams by the correction angle $\theta_2$ along the X-direction in order to correct the chromatic aberration T of magnification of the projection lens 3.

Also the diffraction grating $G_{YA3}$, functioning as the detection light correcting optical element, serves to deflect the detection light beam $DB_W$ by a correction angle $\theta_2$ along the X (meridional) direction, in order to correct the chromatic aberration $\Delta T$ of magnification of the projection lens 3.

In the following there will be explained the r/ arrangement of the diffraction gratings $G_{YA1}$, $G_{YA2}$, $G_{YA3}$ functioning as the correcting optical elements in the present embodiment. Said diffraction gratings are different from those in the 1st embodiment, firstly in that they are arranged along the Y-direction, and that the gratings $G_{YA1}$ and $G_{YA2}$ have a same pitch and the directions of arrangement of the gratings are mutually oppositely inclined, in order to deflect the irradiation light beams $LB_1$, $LB_2$ by the correction angle $\theta_1$ in mutually opposite directions along the Y-direction (measuring direction or the direction connecting the centers of the gratings $G_{YA1}$, $G_{YA2}$), and to deflect said beams by the correction angle $\theta_2$ along the X-direction.

The correction angles and the pitches $P_{YA1}$, $P_{YA2}$, $P_{YA3}$ of the diffraction gratings $G_{YA1}$–$G_{YA3}$ satisfy following relationships:

$$\tan\theta_4 = \sin\theta_2/\sin\theta_1 \tag{6}$$

$$\begin{aligned}P_{YA1} = P_{YA2} &= m_1\lambda_a\cos\theta_4/\sin\theta_1 \\ &= m_2\lambda_a\cos\theta_4/\sin\theta_1\end{aligned} \tag{7}$$

$$P_{YA3} = m_3\lambda_a/\sin\theta_2 \tag{8}$$

wherein $\lambda_a$ is the wavelength of the alignment light beam, $\theta_4$ is the angle of the diffraction gratings $G_{YA1}$, $G_{YA2}$ with respect to the Y-direction (direction of grooves of the diffraction grating $G_{YA3}$), and $m_n$ is the order of diffraction of the beam diffracted by the predetermined correction angle by each of the gratings $G_{YA1}$–$G_{YA3}$ (in the present embodiment, $m_n$ being $m_1$–$m_3$ which are integers). In the present embodiment, it is to be noted that $m_1 = m_2$.

The diffraction gratings $G_{YA1}$–$G_{YA3}$ of the present embodiment, being arranged on the entrance pupil plane P of the projection lens 3 as in the 1st embodiment, can be made negligibly small with respect to the size of the pupil plane and the effect of said gratings on the exposure light can therefore be made negligible, but the steps of said gratings are preferably made to satisfy the aforementioned condition (4) or (5).

As explained above, the 2nd embodiment can provide effects similar to those in the 1st embodiment, as the light paths of the irradiation light beams and the detection light beam can be independently controlled so as to correct the chromatic aberrations (longitudinal chromatic aberration and chromatic aberration of magnification) of the projection lens 3.

The foregoing 2nd embodiment has been limited to the alignment in the Y-direction for the purpose of simplicity, but it is naturally possible to effect the alignment in the X-direction, by forming a reticle mark pitched in the X-direction and an adjacent reticle window in a non-exposure area next to the non-exposure area containing the reticle mark $RM_Y$ and the reticle window WI, and providing a 2nd alignment optical system thereabove. In such case there are provided, along the X-direction, diffraction gratings similar to those above-mentioned gratings $G_{YA1}$–$G_{YA3}$.

Figure 11:
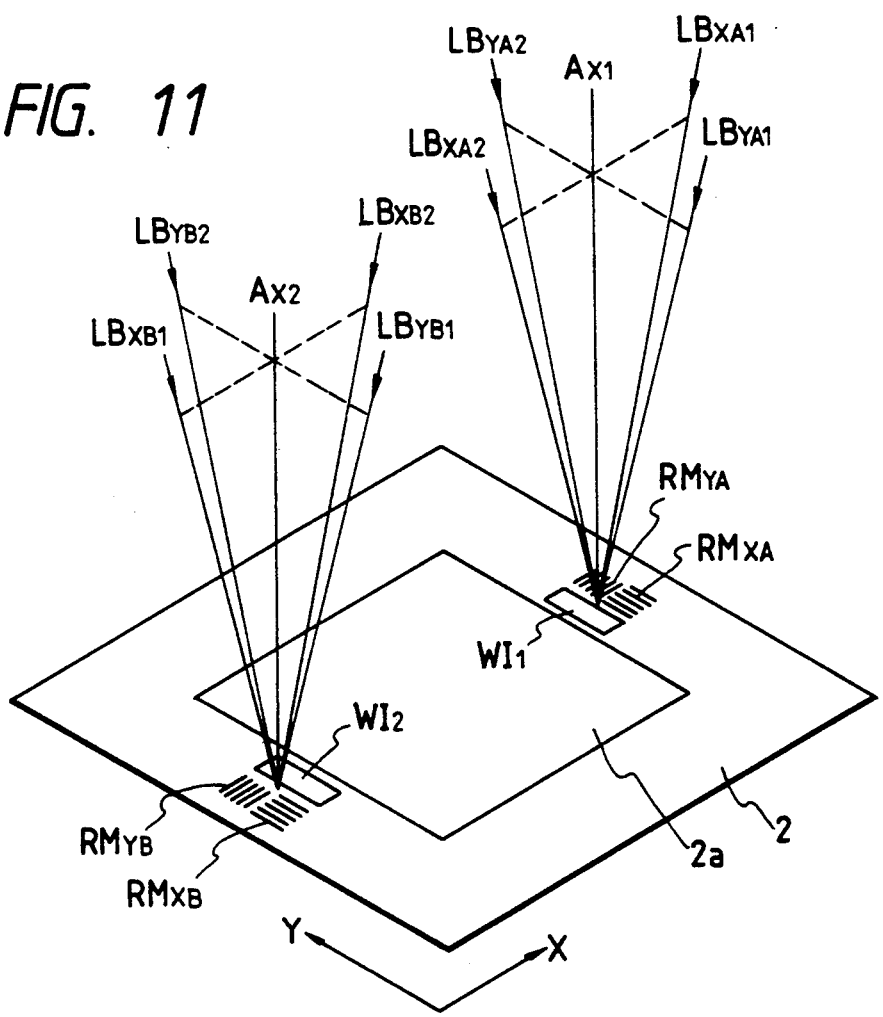
FIG. 11 is a partial perspective view of the alignment system of a 3rd embodiment of the present invention.

In the following there will be explained, with reference to FIG. 11, a 3rd embodiment in which the correcting optical elements of the 1st and 2nd embodiments are combined. As shown in FIG. 11, the reticle 2 is provided with a 1st reticle mark group, positioned outside the exposure area 2a and consisting of a reticle mark $RM_{XA}$ for position detection in the X-direction, a reticle mark $RM_{YA}$ for position detection in the Y-direction, and a reticle window $WI_1$ positioned adjacent thereto.

In addition, said reticle is provided, at an opposite outside position to said 1st reticle mark group, with a 2nd reticle mark group consisting of a reticle mark $RM_{XB}$ for position detection in the X-direction, a reticle mark $RM_{YB}$ for position detection in the Y-direction, and a reticle window $WI_2$ adjacent thereto.

Figure 12:
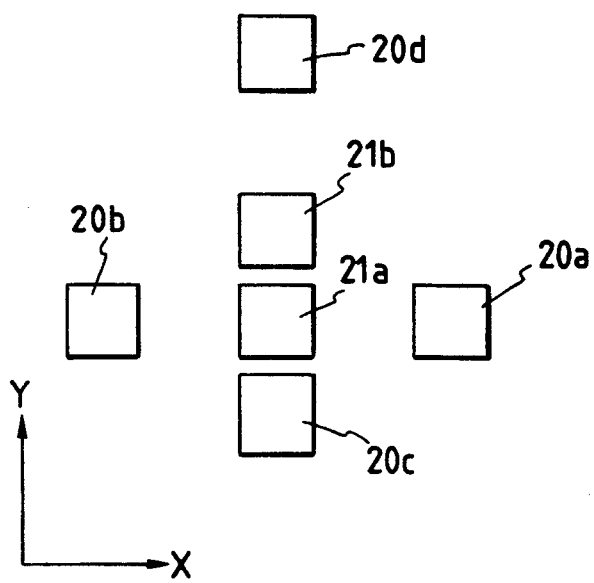
FIG. 12 is a plan view showing the arrangement of detectors in the 3rd embodiment of the present invention.
Figure 14:
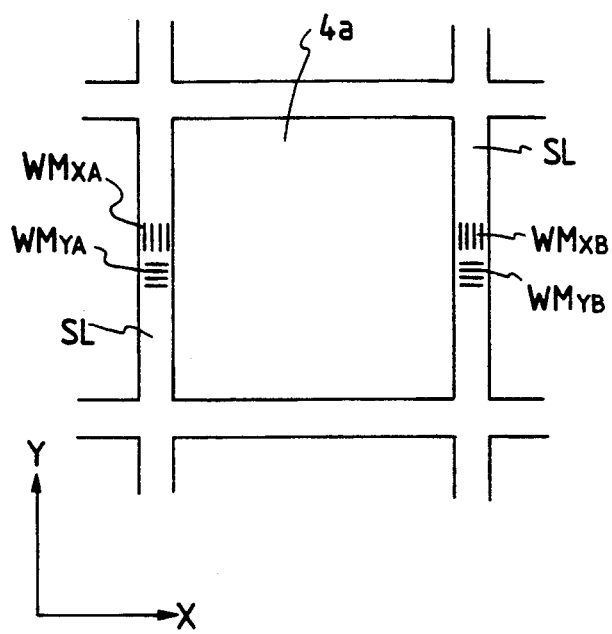
FIG. 14 is a plan view of a shot area on the wafer to be exposed by the reticle of the 3rd embodiment of the present invention.

There are provided, though not illustrated, 1st and 2nd alignment optical systems for respectively irradiating said reticle mark groups with alignment light beams. Said unrepresented 1st alignment optical system is basically constructed same as that in the 1st embodiment shown in FIG. 1, but is provided with another set of AOM's in a direction perpendicular to the plane of FIG. 1, in order to obtain two-dimensional positional information on the reticle 2 and the wafer 4, wherein the beam from the laser unit 10 is split into 4 beams which are respectively guided to two sets of AOM's. Said AOM's irradiate the 1st reticle mark group with two sets of irradiating light beams from four directions with predetermined crossing angles, through the half mirror 14, objective lens 18 and mirror 19. On the other hand, the detection system (20a, 20b, 21) shown in FIG. 1 is constructed, in the present embodiment, as shown in FIG. 12, wherein photodetectors 20a, 20b detect the light beam from the reticle mark $RM_{XA}$ for position detection in the X-direction while pkhotodetectors 20c, 20d detect the light beam from the reticle mark $RM_{YA}$ for position detection in the Y-direction. Also there are provided photodetectors 21a, 21b for respectively detecting the light beams from wafer marks $WM_{XA}$, $WM_{YA}$ for detection in the X- and Y-directions as shown in FIG. 14.

The 2nd alignment optical system is constructed similarly to the last alignment optical system. In FIG. 11, $A_{X1}$ and $A_{X2}$ respectively represent the optical axes of the 1st and 2nd alignment optical systems.

The light beams $LB_{XA1}$, $LB_{XA2}$ from the 1st alignment optical system are directed so as to cover the 1st reticle mark group with a predetermined crossing angle to the reticle mark $RM_{XA}$, and the light beams $LB_{YA1}$, $LB_{YA2}$ also from the 1st alignment optical system are directed so as to cover said 1st reticle mark group with a predetermined crossing angle to the reticle mark $RM_{YA}$. The plane containing the light beams $LB_{XA1}$, $LB_{XA2}$ and that containing the light beams $LB_{YA1}$, $LB_{YA2}$ are mutually perpendicular.

The diffracted light beams obtained from the reticle mark $RM_{XA}$ and proceeding inversely along the paths of the irradiation light beams $LB_{XA1}$, $LB_{XA2}$, and the diffracted light beams obtained from the reticle mark $RM_{YA}$ and proceeding inversely along the paths of the irradiation light beams $LB_{YA1}$, $LB_{YA2}$ are detected by photodetectors 20a, 20b, 20c 20d position, as shown in FIG. 12, optically conjugate with the entrance pupil of the objective lens in the unrepresented alignment optical system, thereby providing two-dimentional positional invormation of the reticle 2 in the X- and Y-directions.

On the other hand, the light beams $LB_{XB1}$, $LB_{XB2}$ from the 2nd alignment optical system are directed so as to cover the 2nd reticle mark group with a predetermined crossing angle to the reticle mark $RM_{XB}$, and the light beams $LB_{YB1}$, $LB_{YB2}$ also from said 2nd alignment optical system are directed so as to cover the 2nd reticle mark group with a predetermined crossing angle to the reticle mark $RM_{YB}$. The plane containing the light beams $LB_{XB1}$, $LB_{XB2}$ is perpendicular to the plane containing the light beams $LB_{YB1}$, $LB_{YB2}$. The diffracted light beams obtained from the reticle mark $RM_{XB}$ and proceeding inversely along the paths of the light beams $LB_{XB1}$, $LB_{XB2}$, and the diffracted light beams obtained from the reticle mark $RM_{YB}$ and proceeding inversely along the paths of the light beams $LB_{YB1}$, $LB_{YB2}$ are detected by photodetectors 20a, 20b, 20c, 20d positioned, as shown in FIG. 12, optically conjugate with the entrance pupil of the objective lens in the unrepresented alignment optical system, thereby providing two-dimensional positional information of the reticle 2 in the X- and Y-directions.

Figure 13:
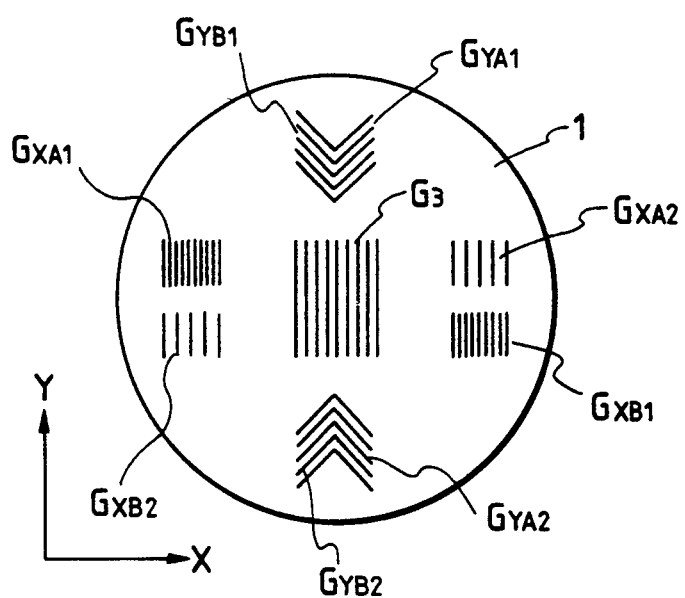
FIG. 13 is a plan view of diffraction gratings formed on the pupil plan of the projection lens of the 3rd embodiment of the present invention.

The irradiation light beams $LB_{XA1}$, $LB_{XA2}$, $LB_{YA1}$, $LB_{YA2}$ transmitted by the reticle window $WI_1$, reach the pupil plane P of an unrepresented projection lens. Also the irradiation light beams $LB_{XB1}$, $LB_{XB2}$, $LB_{YB1}$, $LB_{YB2}$ transmitted by the reticle window $WI_2$ reach said pupil plane P. On said pupil plane there is provided a transparent circular substrate 1 bearing diffraction gratings serving as the irradiation light correcting optical elements and arranged, as shown in FIG. 13, along the X- and Y-directions in symmetrical manner with respect to the center of the pupil.

Diffraction gratings $G_{XA1}$, $G_{XA2}$ serve to deflect the irradiation light beams $LB_{XA1}$, $LB_{XA2}$ from the 1st alignment optical system so as to correct the longitudinal chromatic aberration and the chromatic aberration of magnification of the projection lens as in the 1st embodiment, while diffraction gratings $G_{XB1}$, $G_{XB2}$ similarly serve to deflect the irradiation light beams $LB_{XB1}$, $LB_{XB2}$ from the 2nd alignment optical system so as to correct said chromatic aberrations. Diffraction gratings $G_{YA1}$, $G_{YA2}$ serve to deflect the irradiation light beams $LB_{YA1}$, $LB_{YA2}$ from the 1st alignment optical system so as to correct the longitudinal chromatic aberration and the chromatic aberration of magnification of the projection lens as in the 2nd embodiment, while diffraction gratings $G_{YB1}$, $G_{YB2}$ similarly serve to deflect the irradiation light beams $LB_{YB1}$, $LB_{YB2}$ from the 2nd alignment optical system so as to correct said chromatic aberrations.

The pitches $GP_{XA1}$, $GP_{XA2}$, $GP_{YA1}$, $GP_{YA2}$ respectively of the diffraction gratings $G_{XA1}$, $G_{XA2}$, $G_{XB1}$, $G_{XB2}$, serving to deflect the light beams $LB_{XA1}$, $LB_{XA2}$, $LB_{XA1}$, $LB_{XB2}$ for positional detection in the X-direction, from the 1st and 2nd alignment optical systems, satisfy following relationship:

$$GP_{XA1}(=GP_{XB1}) < GP_{XA2}(=GP_{XB2}) \qquad (9).$$

Also the diffraction gratings, serving to deflect the light beams $LB_{YA1}$, $LB_{YA2}$, $LB_{YB1}$, $LB_{YB2}$ supplied from the 1st and 2nd alignment optical systems for positional detection in the Y-direction, are inclined in mutually opposite manner with respect to the center of the pupil of the projection lens.

Consequently the optical paths of the irradiation light beams from the alignment optical systems are corrected by the diffraction gratings serving as the irradiation light correcting optical elements and arranged as shown in FIG. 13, and each wafer mark formed on the wafer is irradiated from two predetermined directions.

More specifically, the light beams $LB_{XA1}$, $LB_{XA2}$ from the 1st alignment optical system irradiate the wafer mark $XM_{XA}$ from two directions as shown in FIG. 13, and the light beams $LB_{YA1}$, $LB_{YA2}$ coming also from the 1st alignment optical system irradiate the wafer mark $WM_{YA}$ from two predetermined directions. Thus, among the light beams diffracted from said wafer marks $XM_{XA}$, $WM_{YA}$, those used for detection are directed to the center of the pupil of the projection lens.

On the other hand, the light beams $LB_{XB1}$, $LB_{XB2}$ from the 2nd alignment optical system irradiate the wafer mark $WM_{XB}$, while those $LB_{YB1}$, $LB_{YB2}$ coming also from the 2nd alignment optical system irradiate the wafer mark $WM_{YB}$ from two predetermined directions, whereby, among the light beam diffracted from said wafer marks $WM_{XB}$, $WM_{YB}$, those used for detection are directed to the center of the pupil of the projection lens.

At the center of the pupil of the projection lens, there is provided, as shown in FIG. 13, a diffraction grating $G_3$ pitched in the X-direction for serving as a detection light correcting optical element, and said grating $G_3$ deflects said light beams for detection from the wafer marks $XM_{X4}$, $WM_{Y4}$ so as to correct the chromatic aberration of magnification of the projection lens, thereby guiding said light beams to the alignment optical systems. Based on said light beams, two-dimensional positional information of the wafer marks in the X- and Y-directions are detected by photodetectors $21a$, $21b$ which are positioned, as shown in FIG. 12, in optically conjugate manner with the pupils of the objective lenses of unrepresented alignment optical systems.

As explained above, the 3rd embodiment can also provide effects similar to those of the 1st or 2nd embodiment, as said 3rd embodiment can indepedently control the optical paths of the irradiation light beams and the detection light beams so as to correct the chromatic aberrations (longitudinal chromatic aberration and chromatic aberration of magnification) of the projection lens.

Also in this embodiment, the diffraction gratings $G_{XA1}$, $G_{XA2}$, $G_{XB1}$, $G_{XB2}$, functioning as correcting optical elements, preferably satisfy the aforementioned condition (4) or (5) for the magnitude of step.

In the following there will be explained a 4th embodiment of the present invention, with reference to FIG. 15. In this embodiment, diffraction gratings $G_{XA1}$, $G_{XA2}$ serving as the irradiation light correcting optical elements and a diffraction grating $G_{XA3}$ serving as a detection light correcting optical element are positioned as in the 1st embodiment, but said gratings have smaller pitches than in said 1st embodiment, thereby deflecting the irradiation optical paths and the detection optical path more strongly away from the exposure area.

Figure 15:
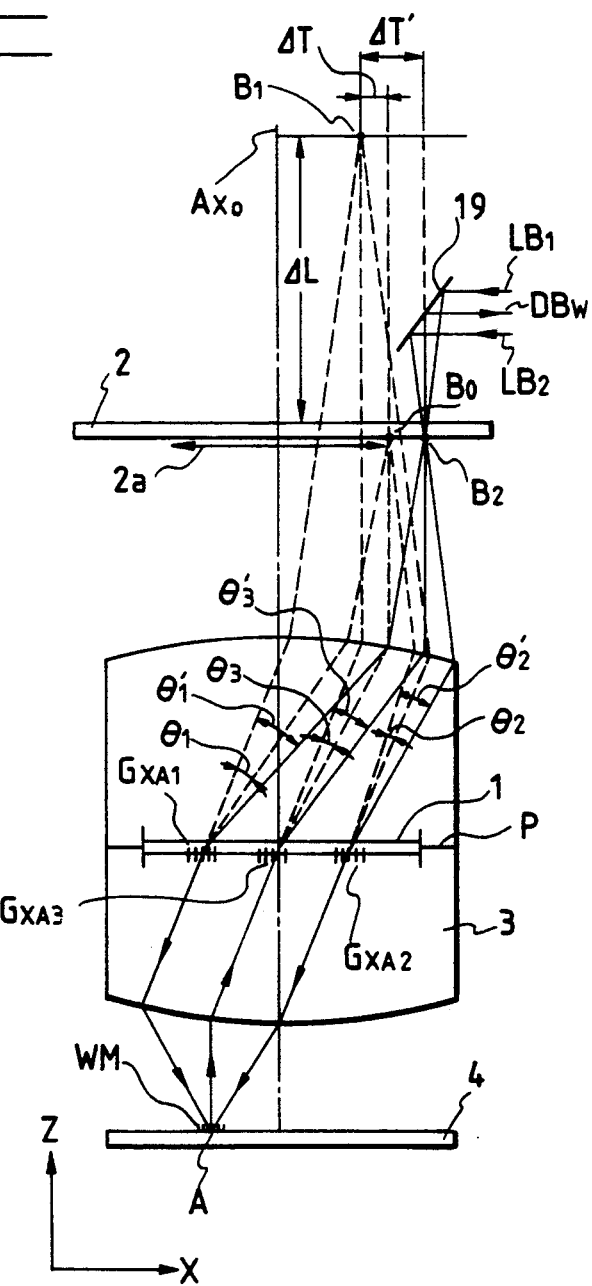
FIG. 15 is a schematic view of a 4th embodiment of the present invention.

In FIG. 15, $B_1$ indicates the image position of a position A in the wafer mark, through the projection lens and with the alignment light (involving the longitudinal chromatic aberration and the chromatic aberration of magnificaiton), while $B_0$ indicates the image position of said position A through the projection lens and with the exposure light (not involving said chromatic aberrations), and $B_2$ indicates the image position of said position A through the projection lens when the longitudinal aberration thereof is corrected while the chromatic aberration of magnification thereof is excessively corrected.

In the foregoing 1st to 3rd embodiments, the diffraction gratings $G_{XA1}$, $G_{XA2}$ serving as the irradiation light correcting optical elements and the diffraction grating $G_{XA3}$ serving as the detection light correcting optical element deflect the irradiation light beams and the detection light beam so as to correct the chromatic aberration of magnification, but these diffraction gratings in the 4th embodiment deflect the irradiation light beams $LB_1$, $LB_2$ and the detection light beam $DB_W$ so as to generate a chromatic aberration $\Delta T'$ of magnification exceeding the chromatic aberration $\Delta T$ of magnification of the projection lens 3. More specifically, the diffraction gratings $G_{XA1}$, $G_{XA2}$ deflect the irradiation light beams $LB_1$, $LB_2$ respectively by correction angles $\theta_1'$, $\theta_2'$ corresponding to a position $B_2$ more separated from the exposure area on the reticle 2, so as to generate a longitudinal chromatic aberration equal to that of the projection lens 3 (thereby correcting said longitudinal chromatic aberration) and to generate a chromatic aberration $\Delta T'$ of magnification exceeding that $\Delta T$ of the projection lens 3 (thereby excessively correcting said chromatic aberration of magnification). Also the diffraction grating $G_{XA3}$ deflects the detection light beam $DB_W$ by a correction angle $\theta_3'$ toward the above-mentioned position $B_2$, more separated from the exposure area on the reticle 2, so as to generate a chromatic aberration $\Delta T'$ of magnification exceeding that of the projection lens 3 (thereby excessively correcting the chromatic aberration of magnification thereof).

In this manner the reticle mark $RM_X$ and the reticle window WI can be positioned farther from the exposure area, and there can be obtained larger freedom for the positioning of the mirror 19 for deflecting the alignment light beams, so as not to interfere with the exposure area.

The present embodiment can provide following additional advantages. In the through-the-reticle (TTR) system, the die-by-die alignment in which the alignment position coincides with the exposure position can be easily achieved by forming the reticle mark on the reticle very close to the circuit pattern area and also forming the wafer mark in the shot area (for example in the street line SL). In such case, though the photoresist is not affected at the alignment of the wafer mark, the photoresist on the wafer mark may be affected at the exposure operation by the exposure light coming out of the reticle window, which is designed for obtaining the alignment light beams for the wafer mark. For this reason the wafer mark may be destructed by a process step after the photoresist development and may become unusable again at the next exposure.

In the present 4th embodiment, however, the reticle window WI can be positioned farther from the exposure area, so that the reticle mark can be protected.

The 4th embodiment naturally provide advantages same as those in the 1st to 3rd embodiments, because the correcting optical elements are positioned on the pupil plane of the projection lens. Also in the present embodiment, the diffraction gratings $G_{XA1}$, $G_{XA2}$, $G_{XA3}$ serving as the correcting optical elements preferably satisfy the aforementioned condition (4) or (5) for the step size.

Figure 16:
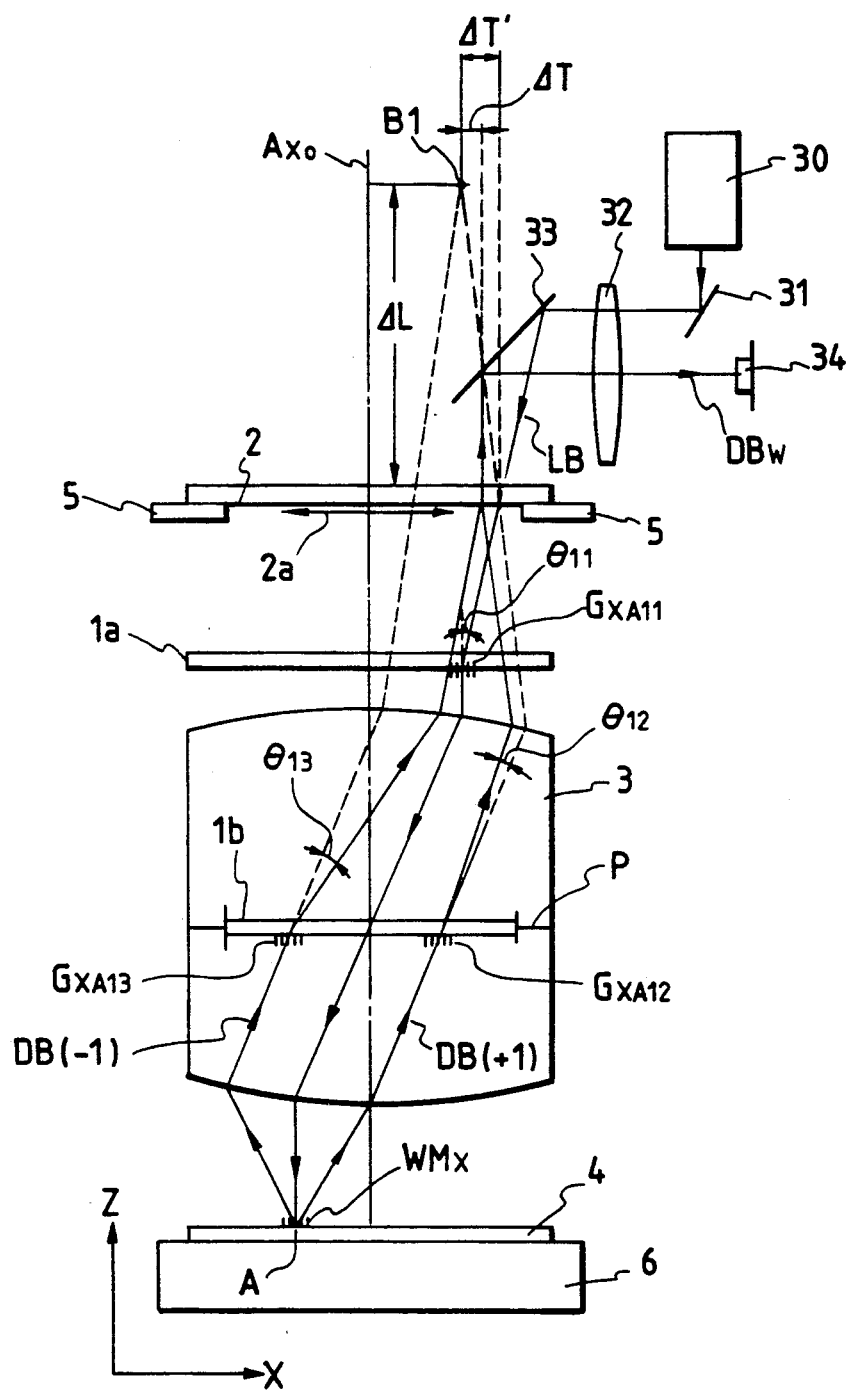
FIG. 16 is a schematic view of a 5th embodiment of the present invention.
Figure 17:
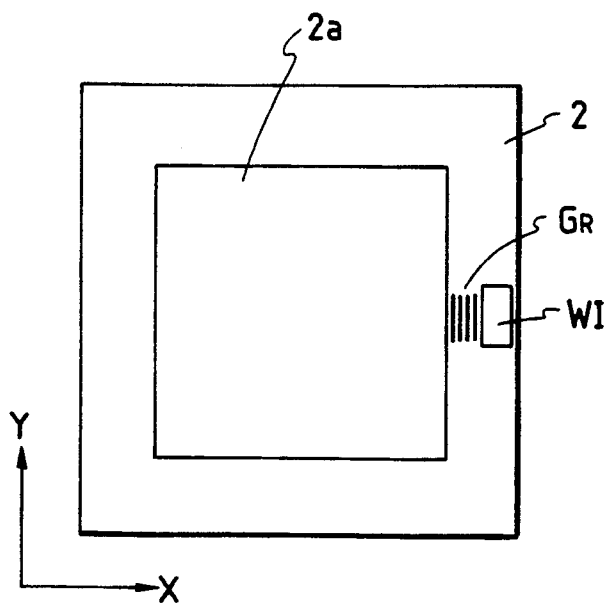
FIG. 17 is a plan view of a reticle in the 5th embodiment of the present invention.
Figure 18A:
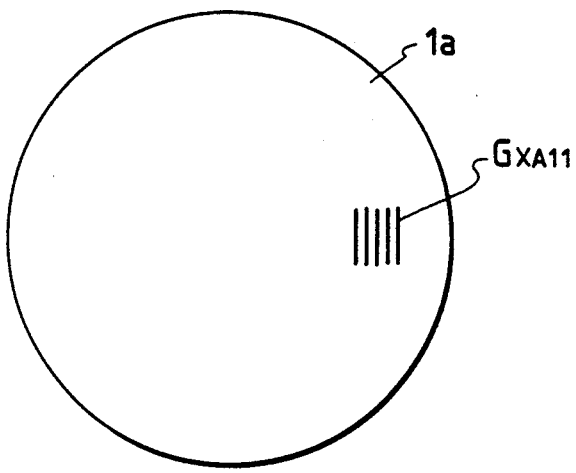
FIGS. 18A and 18B are plan views of diffraction gratings formed between the reticle and the wafer in the 5th embodiment of the present invention.
Figure 18B:
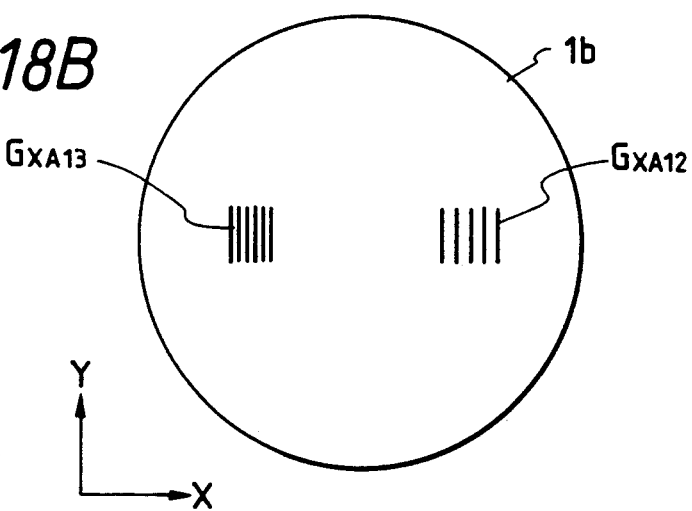

In the following there will be explained a 5th embodiment of the present invention with reference to FIG. 16, in which a light beam from a laser light source 30, emitting the light of a wavelength different from that of the exposure light, is guided through a mirror 31, an objective lens 32 and a mirror 32, and obliquely reaches the reticle 2. Said reticle 2 is provided, as shown in FIG. 17, a reticle window WI and a transmission diffraction grating $G_R$, positioned next thereto. Between the reticle 2 and the projection lens 3, there is provided a transparent circular substrate $1a$ bearing, as shown in FIG. 18A, a diffraction grating $G_{XA11}$ serving as the irradiation light correcting optical element, and, at the pupil position of the projection lens 3, there is provided another transparent circular substrate 16 on which, as shown in FIG. 18B, diffraction gratings $G_{XA12}$, $G_{XA13}$ are formed along the X-direction in symmetrical manner with respect to the center of the pupil.

The light beam LB from the laser light source 30, transmitted by the reticle window WI, is deflected by the diffraction grating $G_{XA11}$ by a correction angle $\theta_{11}$ so as to generate a chromatic aberration $\Delta T'$ of magnification exceeding that of the projection lens, then passes through the center of the projection lens 3 and perpendicularly irradiates the wafer mark WM$_X$ formed on the wafer 4. The ±1st-order diffracted light beams DB(+1), DB(−1) generated from said wafer mark reach the pupil plane P of the projection lens 3, and are respectively deflected by the diffraction gratings G$_{XA12}$, G$_{XA13}$, serving as the detection light correcting optical elements, by correction angles $\theta_{12}$, $\theta_{13}$ so as to generate a longitudinal chromatic aberration ΔL and a chromatic aberration ΔT of magnification equivalent to those of the projection lens 3, thereby correcting said chromatic aberrations. Thereafter said light beams DB(+1), DB(−1) irradiate the transmissive diffraction grating G$_R$, formed on the reticle 2, from two predetermined directions, and are diffracted by said diffraction grating. The diffracted light beams, generated in the perpendicular direction of said diffraction grating, by the irradiation of said light beams DB(+1), DB(−1), proceed with mutual interference through the mirror 33 and the objective lens 32 and are detected by a photodetector 34.

By a scanning motion of an unrepresented wafer stage supporting the wafer 4, the photodetector 34 provides a signal with the intensity corresponding to the position of the wafer 4, and the positioning of the wafer 4 can be achieved by detecting said signal.

As explained in the foregoing, in the present embodiment, the irradiation light beam and the detection light beams can be easily separated, since the amount of chromatic aberration of magnification generated in the diffraction grating G$_{XA11}$, serving as the irradiation light correcting optical element, is made different from that generated in the diffraction gratings G$_{XA12}$, G$_{XA13}$ serving as the detection light correcting optical elements.

Also in the present embodiment, as in the foregoing 1st to 4th embodiments, the diffraction gratings G$_{XA1}$-G$_{XA13}$ functioning as the correcting optical elements need only to be formed in the positions where the irradiation light beams LB$_1$, LB$_2$ and the detection light beam DB$_W$ pass, so that said diffraction grating can in principle be made so small, in area ratio to the pupil plane of the projection lens, that the effect on the exposure light is negligibly small.

In the present embodiment, the diffraction grating G$_{XA11}$ serving as the irradiation light correcting optical element and the diffraction gratings G$_{XA12}$, G$_{XA13}$ serving as the detection light correcting optical elements are dividedly positioned between the reticle and the wafer, but they may be position at the entrance pupil of the projection lens as in the 1st to 4th embodiments.

Furthermore, the diffraction gratings G$_{XA11}$-G$_{XA13}$ preferably satisfy the aforementioned condition (4) or (5) for the step size.

The foregoing 1st to 4th embodiments employ so-called heterodyne alignment method in which the alignment is achieved by irradiating a mark to be detected from two directions with light beams of different frequencies and photoelectrically detecting the interference beat light diffracted from said mark, but the present invention naturally effective also in so-called homodyne alignment method in which, as shown in the 5th embodiment, the alignment is achieved by irradiating the mark to be detected with light, causing two beams, generated from said mark, to interfere each other, and photoelectrically detecting the light intensity corresponding to the wafer position. Also in said 5th embodiment there may be conducted heterodyne alignment by employing a Zeeman laser capable of providing a light beam having slightly different frequencies in the mutually perpendicular directions and photoelectrically detecting the interference beat light.

Furthermore, in the foregoing 1st to 4th embodiments, the irradiation light correcting optical elements and the detection light correcting optical element are separately provided between the reticle and the wafer so as to independently act on the irradiation light beams and the detection light beam, but it is also possible to dispense with the detection light correcting optical element by photoelectrically detecting the interference beat light inversely proceeding along the paths of the light beams irradiating said mark from two directions, namely detecting the interference light generated by the 0-th order diffracted light of the irradiation light beam LB$_1$ and the −2nd or +2nd order diffracted light of the irradiation light beam LB$_2$.

Furthermore, though the 1st to 5th embodiments employ the TTR alignment method, the present invention is not limited to such method. For example, it is naturally possible to effect TTR alignment in which the alignment of the wafer mark is achieved through the projection lens, by providing a mirror between the reticle 2 and the projection lens 3 and also positioning an alignment optical system in the direction of reflection of said mirror.

Furthermore, the diffraction gratings, employed in the foregoing 1st to 5th embodiments and serving as correcting optical elements for controlling the alignment optical paths, may be replaced by small wedge-shaped prisms. In such case, in order to alleviate the influence of said prisms on the exposing light, there is preferably evaporated, on the prism faces irradiated by the exposing light, a thin film with such wavelength separating function as to reflect the exposing light and to transmit the alignment light.

Figure 19:
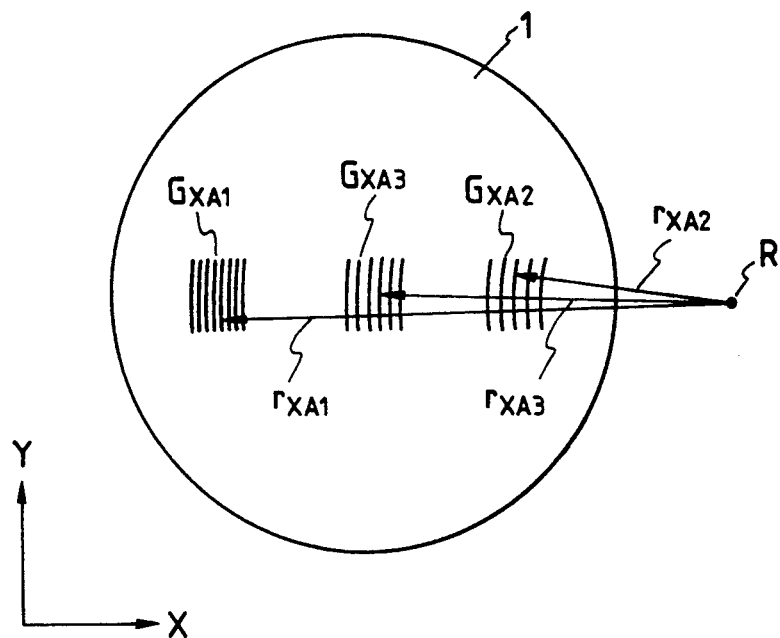
FIG. 19 is a plan view of the correcting optical elements shown in FIG. 4, formed as a Fresnel zone plate.
Figure 20:
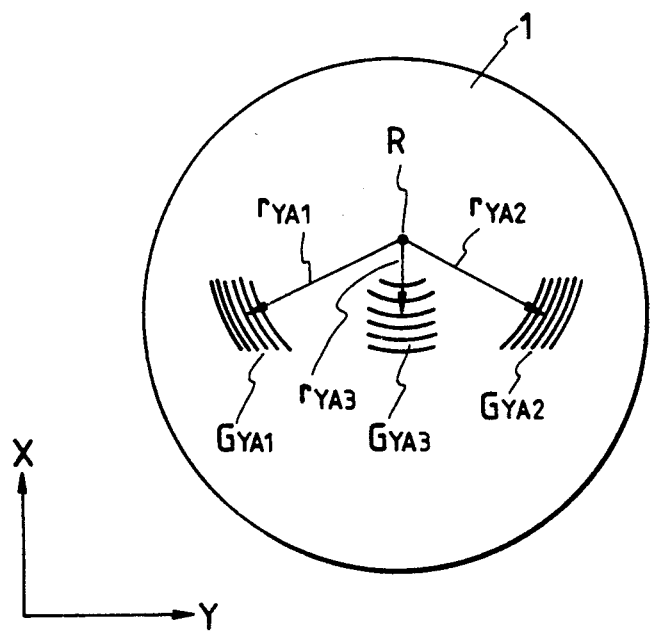
FIG. 20 is a plan view of the correcting optical elements shown in FIG. 9, formed as a Fresnel zone plate.

Furthermore, said correcting optical elements may be constructed as a Fresnel zone plate. For example, the correcting optical elements G$_{XA1}$-G$_{XA3}$, G$_{YA1}$-G$_{YA3}$ shown in FIGS. 4 and 9 may be constructed as concentric Fresnel zone plates with a center R, as shown in FIGS. 19 and 20. The optical elements G$_{XA1}$-G$_{XA3}$, G$_{YA1}$-G$_{YA3}$ shown in FIGS. 19 and 20 have lens function, as they are so constructed to have finer pitch as the distance from the center R becomes larger. In this manner the spreading of the beam at the reticle window can be suppressed.

In such configuration, each Fresnel zone plate (G$_{XA1}$-G$_{XA3}$, G$_{YA1}$-G$_{YA3}$) is preferably composed of phase Fresnel zone plate with steps, and more preferably such phase Fresnel zone plate is so constructed as to satisfy the following condition (10) or (11):

$$d=[(2m+1)\lambda_a]/[2(n_a-1)] \qquad (10)$$

$$d=m_n\lambda_e/(n_3-1) \qquad (11)$$

wherein:
d: step of each phase Fresnel zone plate;
$\lambda_a$: wavelength of alignment light;
$n_a$: refractive index of phase Fresnel zone plate at the wavelength of alignment light;
$\lambda_e$: wavelength of exposure light;
$n_e$: refractive index of phase Fresnel zone plate at the wavelength of exposure light; and
m: integer.

Furthermore, the correcting optical elements shown in FIGS. 19 and 20 may be combined as shown in FIG. 13.

If the wafer mark is reformed or if the size of the exposure area of the reticle is constant, the correcting optical elements of the present invention may naturally be positioned anywhere between the wafer and the reticle.

What is claimed is:

1. An alignment device adapted for use in an exposure apparatus equipped with a projection optical system for transferring a predetermined pattern, formed on a reticle, onto a substrate with an exposure light, and adapted for detecting the position of an alignment mark formed on said substrate, comprising:

light irradiation means for irradiating said alignment mark, through said projection optical system, with alignment light of a wavelength different from that of said exposure light;

detection means for detecting, through said projection optical system, light from said alignment mark;

an irradiation light correcting optical element provided between said reticle and said substrate and adapted for deflecting the irradiation optical path so as to correct, by predetermined amounts, the longitudinal chromatic aberration and the chromatic aberration of magnification of the projection optical system for the irradiation light; and a detection light correcting optical element provided between said reticle and said substrate and adapted for deflecting the detection optical path toward the peripheral part of an exposure area of said reticle, so as to correct, by a predetermined amount, the chromatic aberration of magnification of the projection optical system for the detection light.

2. An alignment device according to claim 1, wherein said irradiation light correcting optical element and said detection light correcting optical element are substantially provided at the position of entrance pupil of said projection optical system.

3. An alignment device according to claim 2, wherein:

said light irradiation means includes beam generation means for generating two beams for irradiating the alignment mark on said substrate from two directions with a predetermined crossing angle; and said beam generation means includes a frequency modulator for providing said two beams with a predetermined frequency difference.

4. An alignment device according to claim 2, wherein:

said light irradiation means includes beam generation means for generating two beams for irradiating the alignment mark on said substrate from two directions with a predetermined crossing angle;

said beam generation means includes a frequency modulator for providing said two beams with a predetermined frequency difference and a reference signal generation unit for generating a reference signal corresponding to said frequency difference; and the position of the alignment mark formed on said substrate is detected, based on an output from said detection means and the reference signal from said reference signal generation unit.

5. An alignment device according to claim 3, wherein:

said irradiation light correcting optical element includes first and second irradiation light correcting optical elements;

said first irradiation light correcting optical element is adapted to deflect, by a predetermined angle, one of the beams from said light irradiation means; and said second irradiation light correcting optical element is adapted to deflect, by a predetermined angle, the other of the beams from said light irradiation means.

6. An alignment device according to claim 5, wherein said first and second irradiation light correcting optical elements and said detection light correcting optical element are composed of diffraction gratings of mutually different pitches.

7. An alignment device according to claim 6, wherein the pitches $P_{XA1}$, $P_{XA2}$, $P_{XA3}$ respectively of said first and second irradiation light correcting optical elements and of said detection light correcting optical element satisfy following relationships:

$$P_{XA1} = m_1 \lambda_a / \sin\theta_1$$

$$P_{XA2} = m_2 \lambda_a / \sin\theta_2$$

$$P_{XA3} = m_3 \lambda_a / \sin\theta_3$$

wherein $\theta_1$, $\theta_2$, $\theta_3$ are beam deflection angles respectively by said first and second irradiation light correcting optical elements and by said detection light correcting optical element; $m_1$, $m_2$, $m_3$ are orders of beam diffraction respectively by said first and second irradiation light correcting optical elements and by said detection light correcting optical element; and $\lambda_a$ is the wavelength of the alignment light.

8. An alignment device according to claim 7, wherein said first and second irradiation light correcting optical elements and said detection light correcting optical element are linearly arranged along a predetermined direction.

9. An alignment device according to claim 5, wherein:

said detection light correcting optical element is composed of a diffraction grating having a predetermined pitch along a predetermined direction;

said first irradiation light correcting optical element is composed of a diffraction grating having a predetermined pitch along a direction inclined, by a predetermined angle, to the direction of pitch of said detection light correcting optical element; and said second irradiation light correcting optical element is composed of a diffraction grating having a predetermined pitch along a direction inclined, by a predetermined angle and oppositely to said first irradiation light correcting optical element, with respect to the direction of pitch of said detection light correcting optical element.

10. An alignment device according to claim 9, wherein:

said first and second irradiation light correcting optical elements have a mutually same pitch in order to deflect the irradiation optical paths by a same angle but in mutually opposite directions; and the pitch $P_{YA1}$ of said first and second irradiation light correcting optical elements and the pitch $P_{YA3}$ of said detection light correcting optical element satisfy following relationships:

$$\tan\theta_4 = \sin\theta_2/\sin\theta_1$$

$$P_{YA1} = m_1\lambda_a\cos\theta_4/\sin\theta_1$$

$$P_{YA3} = m_3\lambda_a/\sin\theta_2$$

wherein $\theta_1$ is beam deflection angle by said first or second irradiation light correcting optical element in a direction connecting the centers of said first and second irradiation light correcting optical elements; $\theta_2$ is beam deflection angle by said detection light correcting optical element; $\theta_4$ is the angle of direction of pitch of said first or second irradiation light correcting optical element with respect to the direction of grooves of said detection light correcting optical element; $m_1$ is the order of diffraction of the beam deflected by a predetermined deflection angle by said first or second irradiation light correcting optical element; $m_3$ is the order of diffraction of the beam deflected by a predetermined deflection angle by said detection light correcting optical element; and $\lambda_a$ is the wavelength of the alignment light.

11. An alignment device according to claim 10, wherein said first and second irradiation light correcting optical elements and said detection light correcting optical element are linearly arranged along a predetermined direction.

12. An alignment device according to claim 5, wherein said first and second irradiation light correcting optical elements and said detection light correcting optical element are composed of concentric Fresnel zone plates having substantially same center points.

13. An alignment device according to claim 5, wherein said first and second irradiation light correcting optical elements and said detection light correcting optical element are composed of phase diffraction gratings, of which step d satisfies a relationship:

$$d = [(2m+1)\lambda_a]/[2(n_a-1)]$$

wherein $\lambda_a$ is the wavelength of the alignment light; $n_a$ is the refractive index of the phase diffraction gratings for the wavelength of the alignment light; and m is an integer.

14. An alignment device according to claim 5, wherein said first and second irradiation light correcting optical elements and said detection light correcting optical element are composed of phase diffraction gratings, of which step d satisfies a relationship:

$$d = m\lambda_e/(n_e-1)$$

wherein $\lambda_e$ is the wavelength of the exposure light; $n_e$ is the refractive index of the phase diffraction gratings for the wavelength of the exposure light; and m is an integer.

15. An alignment device according to claim 1, wherein said irradiation light correcting optical element and said detection light correcting optical element are composed of phase diffraction gratings, of which step d satisfies a relationship:

$$d = [(2m+1)\lambda_a]/[2(n_a-1)]$$

wherein $\lambda_a$ is the wavelength of the phase diffraction gratings; $n_a$ is the refractive index of the phase diffraction gratings for the wavelength of the alignment light; and m is an integer.

16. An alignment device according to claim 1, wherein said irradiation light correcting optical element and said detection light correcting optical element are composed of phase diffraction gratings, of which step d satisfies a relationship:

$$d = m\lambda_e/(n_e-1)$$

wherein $\lambda_e$ is the wavelength of the exposure light; $n_e$ is the refractive index of the phase diffraction gratings for the wavelength of the exposure light; and m is an integer.

17. An alignment device according to claim 1, wherein said irradiation light correcting optical element and said detection light correcting optical element are composed of Fresnel zone plates.

18. An alignment device according to claim 17, wherein said Fresnel zone plates are composed of phase Fresnel zone plates formed by steps d, which satisfy a relationship:

$$d = [(2m+1)\lambda_a]/[2(n_a-1)]$$

wherein $\lambda_a$ is the wavelength of the alignment light; $n_a$ is the refractive index of the phase Fresnel zone plates for the wavelength of the alignment light; and m is an integer.

19. An alignment device according to claim 17, wherein said Fresnel zone plates are composed of phase Fresnel zone plates formed by steps d, which satisfy a relationship:

$$d = m\lambda_e/(n_e-1)$$

wherein $\lambda_e$ is the wavelength of the exposure light; $n_e$ is the refractive index of the phase Fresnel zone plates for the wavelength of the exposure light; and m is an integer.

20. An alignment device adapted for use in an exposure apparatus equipped with a projection optical system for transferring a predetermined pattern, formed on a reticle, onto a substrate with an exposure light, and adapted for setting the position of said substrate by detecting the position of a diffraction grating mark formed on said substrate, comprising:

light irradiation means for irradiating said diffraction grating mark, through said projection optical system, from predetermined two directions, with two alignment light beams having a predetermined frequency difference and also having a wavelength different from that of said exposure light;

detection means for detecting, through said projection optical system, a predetermined diffracted light beam from said diffraction grating mark;

movement means for moving said substrate, based on a detection signal from said detection means;

an irradiation light correcting optical element provided in said projection optical system and adapted for deflecting the irradiation optical paths so as to correct, by predetermined amounts, the longitudinal chromatic aberration and the chromatic aberration of magnification of said projection optical system for said irradiation light beams; and a detection light correcting optical element provided in said projection optical system and adapted for deflecting the detection optical path toward the peripheral part of the exposure area of said reticle, so as to correct, by a predetermined amount, the chromatic aberration of magnification of said projection optical system for said detection light beam;

wherein said irradiation light correcting optical element and said detection light correcting optical element are provided in a plane perpendicular to the optical axis of said projection optical system.

21. An alignment device according to claim 20, wherein said irradiation light correcting optical element and said detection light correcting optical element are provided at the entrance pupil of said projection optical system.

22. An alignment device according to claim 21 wherein:

said light irradiation means includes a frequency modulator for providing two beams, irradiating said diffraction grating mark from predetermined two direction, with a predetermined frequency difference, and a reference signal generation unit for generating a reference signal corresponding to said frequency difference; and said detection means includes a detection signal generation unit for generating a detection signal by the diffracted light beam from said diffraction grating mark, and a phase difference detection unit for detecting the phase difference between said detection signal and said reference signal.

23. An alignment device according to claim 22, wherein:

said irradiation light correcting optical element includes first and second irradiation light correcting optical elements;

said first irradiation light correcting optical element is adapted to deflect, by a predetermined angle, one of the beams from said light irradiation means; and said second irradiation light correcting optical element is adapted to deflect, by a predetermined angle, the other of the beams from said light irradiation means.

24. An alignment device according to claim 23, wherein said first and second irradiation light correcting optical elements and said detection light correcting optical element are composed of diffraction gratings of mutually different pitches.

25. An alignment device according to claim 24, wherein the pitches $P_{XA1}$, $P_{XA2}$, $P_{XA3}$ respectively of said first and second irradiation light correcting optical elements and of said detection light correcting optical element satisfy following relationships:

$$P_{XA1} = m_1\lambda_a/\sin\theta_1$$

$$P_{XA2} = m_2\lambda_a/\sin\theta_2$$

$$P_{XA3} = m_3\lambda_a/\sin\theta_3$$

wherein, $\theta_1$, $\theta_2$, $\theta_3$ are beam deflection angles respectively by said first and second irradiation light correcting optical elements and by said detection light correcting optical element; $m_1$, $m_2$, $m_3$ are orders of beam diffraction respectively by said first and second irradiation light correcting optical elements and by said detection light correcting optical element; and $\lambda_a$ is the wavelength of the alignment light.

26. An alignment device according to claim 25, wherein said first and second irradiation light correcting optical elements and said detection light correcting optical element are composed of phase diffraction gratings, of which step d satisfies a relationship:

$$d = [(2m+1)\lambda_a]/[2(n_a-1)]$$

wherein $\lambda_a$ is the wavelength of the alignment light; $n_a$ is the refractive index of the phase diffraction gratings for the wavelength of the alignment light; and m is an integer.

27. An alignment device according to claim 25, wherein said first and second irradiation light correcting optical elements and said detection light correcting optical element are composed of phase diffraction gratings, of which step d satisfies a relationship:

$$d = m\lambda_e/(n_e-1)$$

wherein $\lambda_e$ is the wavelength of the exposure light; $n_e$ is the refractive index of the phase diffraction grating for the wavelength of the exposure light; and m is an integer.

28. An alignment device according to claim 23, wherein:

said detection light correcting optical element is composed of a diffraction grating having a predetermined pitch along a predetermined direction;

said first irradiation light correcting optical element is composed of a diffraction grating having a predetermined pitch along a direction inclined, by a predetermined angle, to the direction of pitch of said detection light correcting optical element; and said second irradiation light correcting optical element is composed of a diffraction grating having a predetermined pitch along a direction inclined, by a predetermined angle and oppositely to said first irradiation light correcting optical element, with respect to the direction of pitch of said detection light correcting optical element.

29. An alignment device according to claim 28, wherein:

said first and second irradiation light correcting optical elements have a mutually same pitch in order to deflect the irradiation optical paths by a same angle but in mutually opposite directions; and the pitch $P_{YA1}$ of said first and second irradiation light correcting optical elements and the pitch $P_{YA3}$ of said detection light correcting optical element satisfy following relationships:

$$\tan\theta_4 = \sin\theta_2/\sin\theta_1$$

$$P_{YA1} = m_1\lambda_a\cos\theta_4/\sin\theta_1$$

$$P_{YA3} = m_3\lambda_a/\sin\theta_2$$

wherein $\theta_1$ is the beam deflection angle by said first or second irradiation light correcting optical element in a direction connecting the centers of said first and second irradiation light correcting optical elements; $\theta_2$ is the beam deflection angle by said detection light correcting optical element; $\theta_4$ is the angle of direction of pitch of said first or second irradiation light correcting optical element with respect to the direction of grooves of said detection light correcting optical element; $m_1$ is the order of diffraction of the beam deflected by a predetermined deflection angle by said first or second irradiation light correcting optical element; $m_3$ is the order of diffraction of the beam deflected by a predetermined deflection angle by said detection light correcting optical element; and $\lambda_a$ is the wavelength of the alignment light.

30. An alignment device according to claim 29, wherein said first and second irradiation light correcting optical elements and said detection light correcting optical element are composed of phase diffraction gratings, of which step d satisfies a relationship:

$$d=[(2m+1)\lambda_a]/[2(n_a-1)]$$

wherein $\lambda_a$ is the wavelength of the alignment light; $n_a$ is the refractive index of the phase diffraction gratings for the wavelength of the alignment light; and m is an integer.

31. An alignment device according to claim 29, wherein said first and second irradiation light correcting optical elements and said detection light correcting optical element are composed of phase diffraction gratings, of which step d satisfies a relationship:

$$d=m\lambda_e/(n_e-1)$$

wherein $\lambda_e$ is the wavelength of the exposure light; $n_e$ is the refractive index of the phase diffraction gratings for the wavelength of the exposure light; and m is an integer.

32. An alignment device according to claim 23, wherein said first and second irradiation light correcting optical elements and said detection light correcting optical element are composed of concentric Fresnel zone plates having substantially same center points.

33. An alignment device according to claim 32, wherein said Fresnel zone plates are composed of phase Fresnel zone plates formed by steps d, which satisfy a relationship:

$$d=[(2m+1)\lambda_a]/[2(n_a-1)]$$

wherein $\lambda_a$ is the wavelength of the alignment light: $n_a$ is the refractive index of the phase Fresnel zone plates for the wavelength of the alignment light; and m is an integer.

34. An alignment device according to claim 32, wherein said Fresnel zone plates are composed of phase Fresnel zone plates formed by steps d, which satisfy a relationship:

$$d=m\lambda_e/(n_e-1)$$

wherein $\lambda_e$ is the wavelength of the exposure light; $n_e$ is the refractive index of the phase Fresnel zone plates for the wavelength of the exposure light; and m is an integer.

35. An alignment device adapted for use in an exposure apparatus equipped with a projection optical system for transferring a predetermined pattern, formed on a reticle, onto a substrate with an exposure light, and adapted for detecting the position of a diffraction grating mark formed on said substrate, comprising:

light irradiation means for irradiating said diffraction grating mark, through said projection optical system, with alignment light of a wavelength different from that of said exposure light;

detection means for detecting, through said projection optical system, diffracted light from said diffraction grating mark;

an irradiation light correcting optical element provided between said reticle and said substrate and adapted for deflecting the irradiation optical path so as to correct, by a predetermined amount, the chromatic aberration of magnification of the projection optical system for the irradiation light; and a detection light correcting optical element provided between said reticle and said substrate and adapted for deflecting the detection optical path toward the peripheral part of an exposure area of said reticle, so as to correct, by predetermined amounts, the longitudinal chromatic aberration and the chromatic aberration of magnification of the projection optical system for said detection light.

36. An alignment device according to claim 35, wherein said detection light correcting optical element includes first and second detection light correcting optical element for deflecting, by predetermined angles, predetermined two diffracted beams among plural diffracted beams generated from said diffraction grating mark.

37. An alignment device according to claim 36, wherein said irradiation light correcting optical element and said first and second detection light correcting optical elements are composed of diffraction gratings of mutually different pitches.

38. An alignment device according to claim 36, wherein:

said irradiation light correcting optical element is composed of a diffraction grating having a predetermined pitch along a predetermined direction;

said first detection light correcting optical element is composed of a diffraction grating having a predetermined pitch along a direction inclined, by a predetermined angle, to the direction of pitch of said irradiation light correcting optical element; and said second detection light correcting optical element is composed of a diffraction grating having a predetermined pitch along a direction inclined, by a predetermined angle and oppositely to said first detection light correcting optical element, with respect to the direction of pitch of said irradiation light correcting optical element.

39. An alignment device according to claim 36, wherein said irradiation light correcting optical element and said first and second detection light correcting optical elements are composed of Fresnel zone plates.

40. An alignment device according to claim 36, wherein said irradiation light correcting optical element and said first and second detection light correcting optical elements are composed of phase diffraction gratings, of which step d satisfies a relationship:

$$d=[(2m+1)\lambda_a]/[2(n_a-1)]$$

wherein $\lambda_a$ is the wavelength of the alignment light; $n_a$ is the refractive index of the phase diffraction gratings for the wavelength of the alignment light; and m is an integer.

41. An alignment device according to claim 36, wherein said irradiation light correcting optical element and said first and second detection light correcting optical elements are composed of phase diffraction gratings, of which step d satisfies a relationship:

$$d=m\lambda_e/(n_e-1)$$

wherein $\lambda_e$ is the wavelength of the exposure light; $n_e$ is the refractive index of the phase diffraction gratings for the wavelength of the exposure light; and m is an integer.

42. An alignment device adapted for use in an exposure apparatus equipped with a projection optical system for transferring a predetermined pattern, formed on a reticle, onto a substrate with an exposure light, and adapted for detecting the position of an alignment mark formed on said substrate, comprising:

light irradiation means for irradiating said alignment mark, through said projection optical system, with alignment light of a wavelength different from that of said exposure light;

detection means for detecting, through said projection optical system, light from said alignment mark;

an irradiation light correcting optical element for generating a longitudinal chromatic aberration and a chromatic aberration of magnification which are opposite, in direction, to the longitudinal chromatic aberration and the chromatic aberration of magnification of said projection optical system for the irradiation light, and a detection light correcting optical element for generating a chromatic aberration of magnification which is opposite, in direction, to the chromatic aberration of magnification of said projection optical system for the detection light, both elements being positioned between said reticle and said substrate;

wherein said irradiation light correcting optical element is adapted to generate a longitudinal chromatic aberration equal to that of said projection optical system at a first position at which an image of said alignment mark is projected by said projection optical system onto said reticle under said irradiation light, and also to generate a chromatic aberration of magnification not less than that of said projection optical system at said first position, thereby deflecting the irradiation optical path toward the peripheral part of a non-exposure area of which boundary includes a second position where an image of said alignment mark is projected by said projection optical system onto said reticle under said exposure light; and said detection light correcting optical element is adapted to generate a chromatic aberration of magnification exceeding that of said projection optical system at said first position, thereby deflecting the detection optical path toward the peripheral part of the non-exposure are of which boundary contains said second position.

43. An alignment device according to claim 42, wherein:

said irradiation light correcting optical element includes first and second irradiation light correcting optical elements; and said first and second irradiation light correcting optical elements and said detection light correcting optical element are composed of phase diffraction gratings, of which step d satisfies a relationship:

$$d = [(2m+1)\lambda_a]/[2(n_a-1)]$$

wherein $\lambda_a$ is the wavelength of the alignment light; $n_a$ is the refractive index of the phase diffraction gratings for the wavelength of the alignment light; and m is an integer.

44. An alignment device according to claim 42, wherein:

said irradiation light correcting optical element includes first and second irradiation light correcting optical elements; and said first and second irradiation light correcting optical elements and said detection light correcting optical element are composed of phase diffraction gratings, of which step d satisfies a relationship:

$$d = m\lambda_e/(n_e-1)$$

wherein $\lambda_e$ is the wavelength of the exposure light; $n_e$ is the refractive index of the phase diffraction gratings for the wavelength of the exposure light; and m is an integer.

45. An alignment device according to claim 42, wherein:

said irradiation light correcting optical element includes first and second irradiation light correcting optical elements; and said first and second irradiation light correcting optical elements and said detection light correcting optical element are composed of Fresnel zone plates.

46. An alignment device according to claim 45, wherein said Fresnel zone plates are composed of phase Fresnel zone plates formed by steps d which satisfy following relationship:

$$d = [(2m+1)\lambda_a]/[2(n_a-1)]$$

wherein $\lambda_a$ is the wavelength of the alignment light; $n_a$ is the refractive index of the phase Fresnel zone plates for the alignment light; and m is an integer.

47. An alignment device according to claim 45, wherein said Fresnel zone plates are composed of phase Fresnel zone plates formed by steps d, which satisfy following relationship:

$$d = m\lambda_e(n_e-1)$$

wherein $\lambda_e$ is the wavelength of the exposure light; $n_e$ is the refractive index of the phase Fresnel zone plates for the wavelength of the exposure light; and m is an integer.

48. An alignment device adapted for use in an exposure apparatus equipped with a projection optical system for transferring a predetermined pattern, formed on a reticle, onto a substrate with an exposure light, and adapted for detecting the position of an alignment mark formed on said substrate, comprising:

light irradiation means for irradiating said alignment mark, through said projection optical system, with alignment light of a wavelength different from that of said exposure light;

detection means for detecting, through said projection optical system, light from said alignment mark;

an irradiation light correcting optical element for generating a chromatic aberration which is opposite, in direction, to that of said projection optical system for the irradiation light, and a detection light correcting optical element for generating a longitudinal chromatic aberration and a chromatic aberration of magnification which are opposite, in direction, to those of said projection optical system for the detection light, both elements being positioned between said reticle and said substrate;

wherein said irradiation light correcting optical element is adapted to generate a chromatic aberration of magnification exceeding that of said projection optical system at a first position at which an image of said alignment mark is projected by said projection optical system onto said reticle under said irradiation light, thereby deflecting the irradiation optical path toward the peripheral part of a non-exposure area of which boundary includes a second position where an image of said alignment mark is projected by said projection optical system onto said reticle under said exposure light; and said detection light correcting optical element is adapted to generate a longitudinal chromatic aberration equal to that of said projection optical system at said first position and also to generate a chromatic aberration of magnification exceeding that of said projection optical system at said first position, thereby deflecting the detection optical path toward the peripheral part of the non-exposure area of which boundary contains said second position.

49. An alignment device according to claim 48, wherein:

said detection light correcting optical element includes first and second detection light correcting optical elements; and said irradiation light correcting optical element and said first and second detection light correcting optical elements are composed of phase diffraction gratings, of which step d satisfies a relationship:

$$d = [(2m+1)\lambda_a]/[2(n_a-1)]$$

wherein $\lambda_a$ is the wavelength of the alignment light; $n_a$ is the refractive index of the phase diffraction gratings for the wavelength of the alignment light; and m is an integer.

50. An alignment device according to claim 48, wherein:

said detection light correcting optical element includes first and second detection light correcting optical elements; and said irradiation light correcting optical element and said first and second detection light correcting optical elements are composed of phase diffraction gratings, of which step d satisfies a relationship:

$$d = m\lambda_e/(n_e-1)$$

wherein $\lambda_e$ is the wavelength of the exposure light; $n_e$ is the refractive index of the phase diffraction gratings for the wavelength of the exposure light; and m is an integer.

51. An alignment device according to claim 48, wherein:

said detection light correcting optical element includes first and second detection light correcting optical elements; and said irradiation light correcting optical element and said first and second detection light correcting optical elements are composed of Fresnel zone plates.

52. An alignment device according to claim 51, wherein said Fresnel zone plates are composed of phase Fresnel zone plates formed by steps d which satisfy following relationship:

$$d = [(2m+1)\lambda_a]/2(n_a-1)]$$

wherein $\lambda_a$ is the wavelength of the alignment light; $n_a$ is the refractive index of the phase Fresnel zone plates for the alignment light; and m is an integer.

53. An alignment device according to claim 51, wherein said Fresnel zone plates are composed of phase Fresnel zone plates formed by steps d, which satisfy following relationship:

$$d = m\lambda_e(n_e-1)$$

wherein $\lambda_e$ is the wavelength of the exposure light; $n_e$ is the refractive index of the phase Fresnel zone plates for the wavelength of the exposure light; and m is an integer.

* * * * *